US012604527B2

(12) United States Patent
Lai et al.

(10) Patent No.: US 12,604,527 B2
(45) Date of Patent: Apr. 14, 2026

(54) DISPLAY PANEL AND DISPLAY DEVICE

(71) Applicant: Xiamen Tianma Display Technology Co., Ltd., Xiamen (CN)

(72) Inventors: Qingjun Lai, Xiamen (CN); Jinjin Yang, Xiamen (CN); Yihua Zhu, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 572 days.

(21) Appl. No.: 18/075,605

(22) Filed: Dec. 6, 2022

(65) Prior Publication Data

US 2023/0178565 A1      Jun. 8, 2023

(30) Foreign Application Priority Data

Aug. 18, 2022     (CN) .......................... 202210994577.3

(51) Int. Cl.
 H10D 86/60          (2025.01)
 H10D 86/40          (2025.01)
(52) U.S. Cl.
 CPC ........... H10D 86/60 (2025.01); H10D 86/441 (2025.01); H10D 86/481 (2025.01)
(58) Field of Classification Search
 CPC .. H10D 86/60; H10D 30/6755; H10D 86/423; H10D 30/6734
 See application file for complete search history.

(56) References Cited

U.S. PATENT DOCUMENTS

| | | | |
|---|---|---|---|
| 2018/0226430 A1* | 8/2018 | Lee ....................... | G02F 1/1345 |
| 2023/0180549 A1* | 6/2023 | Li ........................ | H10K 59/131 |
| | | | 257/40 |
| 2023/0231294 A1* | 7/2023 | Kim ..................... | H01Q 1/2266 |
| | | | 343/702 |

* cited by examiner

*Primary Examiner* — Tony Tran
(74) *Attorney, Agent, or Firm* — KDW Firm PLLC

(57)                    ABSTRACT

Provided are a display panel and a display device. The display panel includes data lines, signal wirings and connection wires. The data lines are located in a display region, and the data line includes a first data line and a second data line. The signal wiring includes a first signal wiring and a second signal wiring. The connection wires are located in the display region, the connection wire includes a first connection wire and a second connection wire, where the first connection wire is connected to the first data line and the first signal wiring, and the second connection wire is connected to the second data line and the second signal wiring; the first connection wire includes a first sub-subsection and a first sub-wire which are connected to each other, the second connection wire includes a second sub-subsection and a second sub-wire which are connected to each other.

12 Claims, 21 Drawing Sheets

10

10

10

DISPLAY PANEL AND DISPLAY DEVICE

CROSS-REFERENCE TO RELATED APPLICATION(S)

This application claims priority to Chinese Patent Application No. 202210994577.3 filed Aug. 18, 2022, the disclosure of which is incorporated herein by reference in its entirety.

TECHNICAL FIELD

Embodiments of the present disclosure relate to the field of display technologies and, in particular, to a display panel and a display device.

BACKGROUND

In recent years, in order to increase a resolution ratio and a screen-to-body ratio of a display panel, wires in the display panel are more and more densely disposed, but wires at different positions have different loss of signal transmission, so that the signal transmission in the display panel is unstable, and thus the display effect of the display panel is affected.

SUMMARY

Embodiments of the present disclosure provide a display panel and a display device, a length of a connection wire is adjusted, so that the balance of length differences of different connection wires is ensured, and further the stability of a signal transmission of the display panel is improved.

In a first aspect, an embodiment of the present disclosure provides a display panel, the display panel includes a display region and a non-display region, where the non-display region is at least located on a side of the display region. The display panel further includes multiple data lines, multiple signal wirings and connection wires. The multiple data lines are located in the display region, and the multiple data lines include a first data line and a second data line. Each of the multiple signal wirings is connected to a respective one of the multiple data lines, and the multiple signal wirings includes a first signal wiring and a second signal wiring. The connection wires are located in the display region, the connection wires include a first connection wire and a second connection wire, where the first connection wire is connected to the first data line and the first signal wiring, and the second connection wire is connected to the second data line and the second signal wiring; the first connection wire includes a first sub-subsection and a first sub-wire which are connected to each other, an extension direction of the first sub-subsection intersects an extension direction of the first sub-wire, the second connection wire includes a second sub-subsection and a second sub-wire which are connected to each other, and an extension direction of the second sub-subsection intersects an extension direction of the second sub-wire; and lengths of the first sub-subsection, the first sub-wire, the second sub-subsection and the second sub-wire are respectively L11, L12, L21 and L22; where $(L11-L21)\times(L12-L22)\leq0$.

In a second aspect, an embodiment of the present disclosure provides a display device, the display device includes the display panel described in any one of items in the first aspect.

BRIEF DESCRIPTION OF DRAWINGS

In order to more clearly explain the technical schemes of the exemplary embodiments of the present disclosure, the drawings used for describing the embodiments will be briefly introduced below. Apparently, the drawings to be introduced are merely the drawings of part of the embodiments of the present disclosure to be described, rather than all drawings. For those of ordinary skill in the art, other drawings may also be obtained without the exercise of inventive faculty according to these drawings.

DETAILED DESCRIPTION

Figure 1:
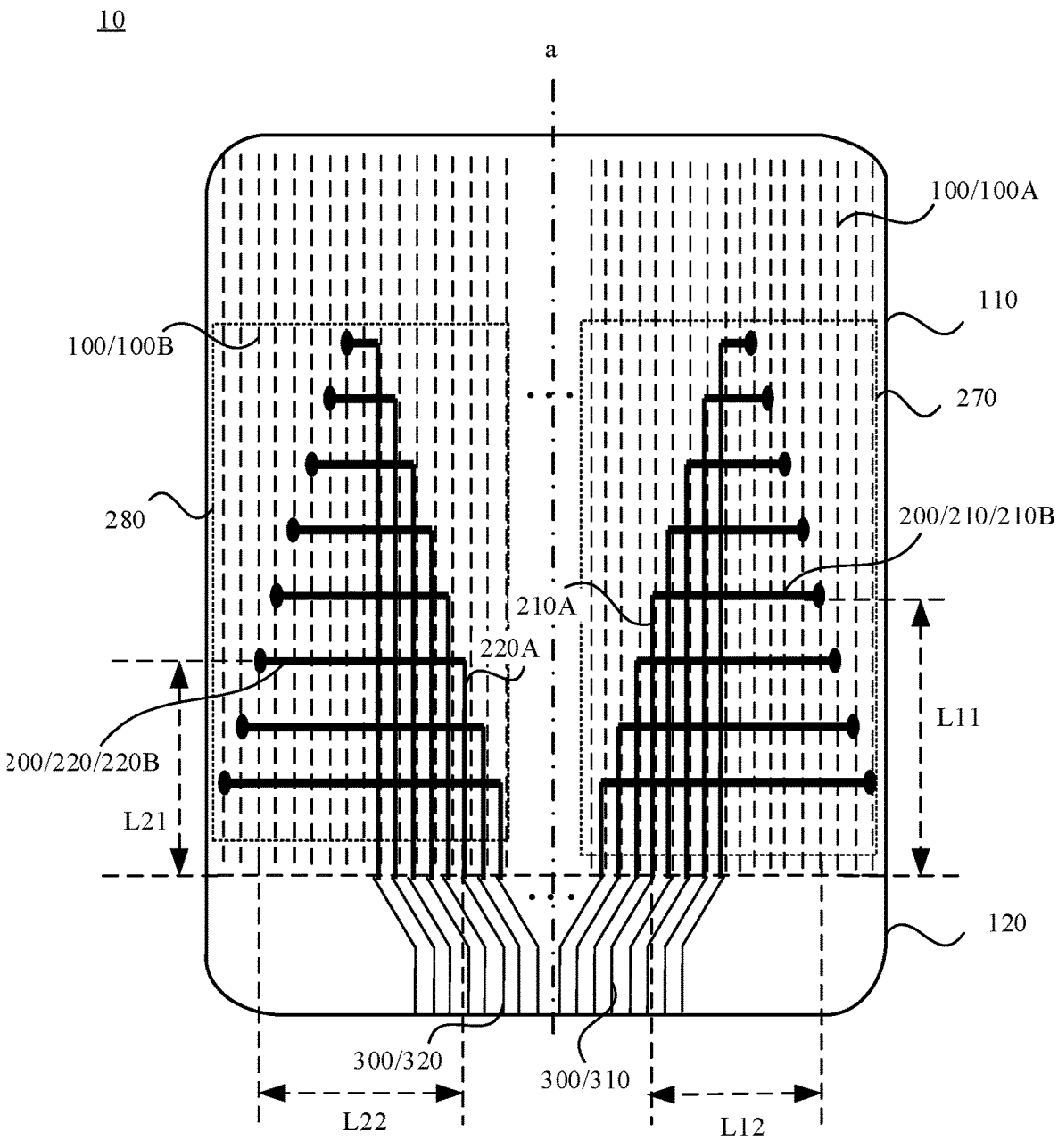
FIG. 1 is a schematic structural view of a display panel provided in an embodiment of the present disclosure.

The present disclosure will be further described in detail in conjunction with the drawings and embodiments below. It should be understood that the specific embodiments described herein are merely used for explaining the present disclosure and are not intended to limit the present disclosure. It should also be noted that, for ease of description, only some, but not all, of the structures related to the present disclosure are shown in the drawings.

Figure 2:
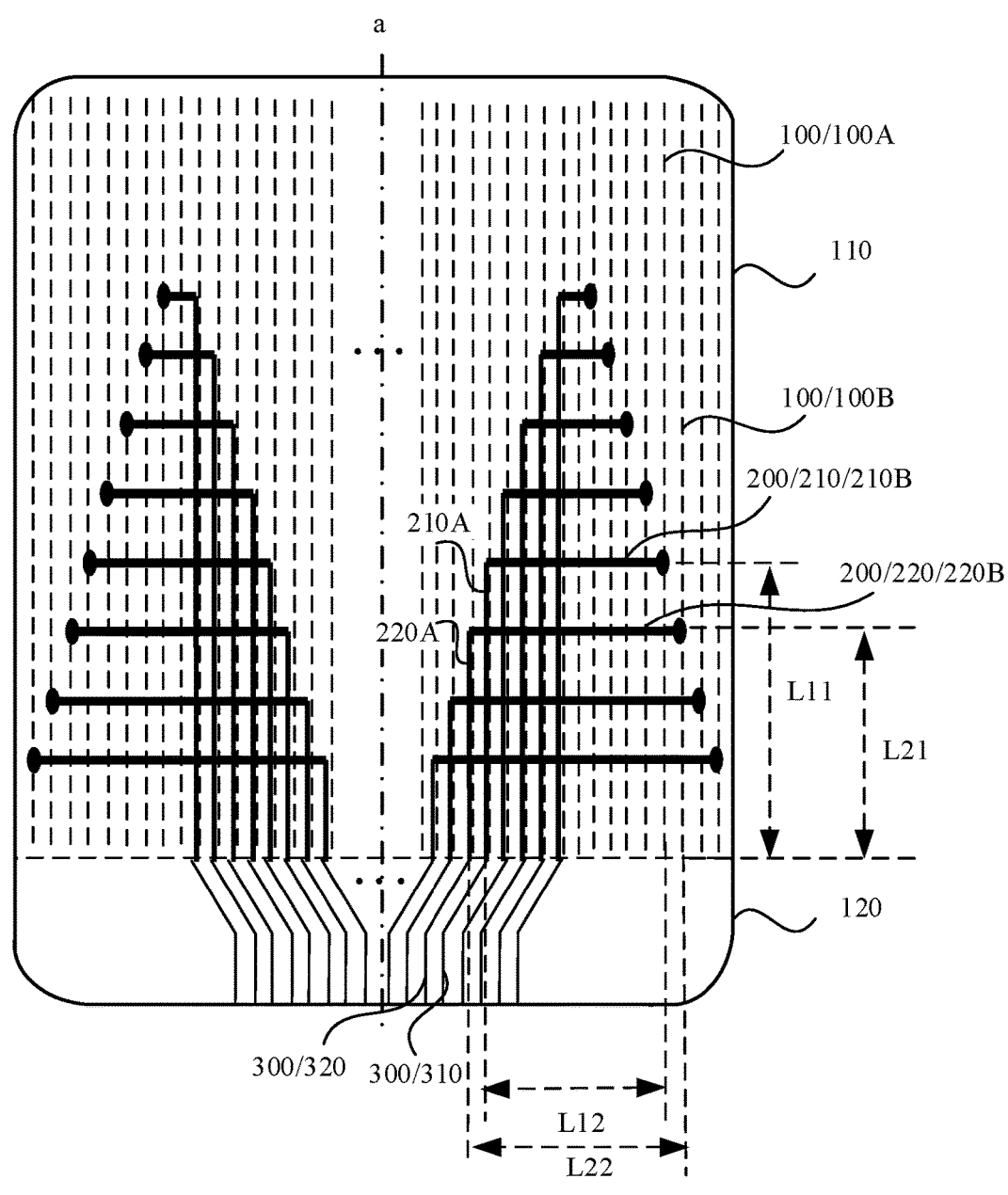
FIG. 2 is a schematic structural view of another display panel provided in an embodiment of the present disclosure.

FIG. 1 is a schematic structural view of a display panel provided in an embodiment of the present disclosure. FIG. 2 is a schematic structural view of a display panel provided in an embodiment of the present disclosure. Referring to FIGS. 1 and 2, the display panel 10 provided in the embodiments of the present disclosure includes a display region 110 and a non-display region 120. The non-display region 120 is at least located on a side of the display region 110. The display panel 10 further includes multiple data lines 100, multiple signal wirings 300 and connection wires 200. The multiple data lines 100 are located in the display region 110, and the multiple data lines 100 include a first data line 100A and a second data line 100B. Each of the multiple signal wirings 300 is connected to a respective one of the multiple data lines 100, and the multiple signal wirings 300 includes a first signal wiring 310 and a second signal wiring 320. The connection wires 200 are located in the display region 110, the connection wires 20 include a first connection wire 210 and a second connection wire 220, where the first connection wire 210 is connected to the first data line 100A and the first signal wiring 310, and the second connection wire 220 is connected to the second data line 100B and the second signal wiring 320; the first connection wire 210 includes a first sub-subsection 210A and a first sub-wire 210B which are connected to each other, an extension direction of the first sub-subsection 210A intersects an extension direction of the first sub-wire 210B, the second connection wire 220 includes a second sub-subsection 220A and a second sub-wire 220B which are connected to each other, and an extension direction of the second sub-subsection 220A intersects an extension direction of the second sub-wire 220B; and lengths of the first sub-subsection 210A, the first sub-wire 210B, the second sub-subsection 220A and the second sub-wire 220B are respectively L11, L12, L21 and L22; where $(L11-L21)\times(L12-L22)\leq0$.

In an embodiment, the display panel 10 includes a display region 110 and a non-display region 120, and the display region 110 includes a sub-pixel (not specifically shown in the drawings) and a display signal line, such as a data line 100, connected to the sub-pixel, for implementing a display function of the display panel 10. The non-display region 120 includes a display controller, such as a driver chip (not specifically shown in the drawings), connected to the display signal line, and the display controller provides a display signal for the display signal line to drive the display panel 10 to implement the display function. Exemplarily, referring to FIG. 1, the non-display region 120 may be a lower bezel region located on a side of the display region 110. A position relation between the display region 110 and the non-display region 120 is not specifically limited in the embodiments of the present disclosure.

Further, referring to FIG. 1, the display panel 10 includes multiple data lines 100, multiple connection wires 200 and multiple signal wirings 300, only part of the wires are shown in FIG. 1, and a number of the data lines 100, the connection wires 200 and the signal wirings 300 is not specifically limited in the embodiments of the present disclosure. The data line 100 and the signal wiring 300 are electrically connected through the connection wire 200, so that a normal transmission of a data signal is ensured. An electrical connection between the first data line 100A and the first signal wiring 310 is implemented by the first connection wire 210, and an electrical connection between the second data line 100B and the second signal wiring 320 is implemented by the second connection wire 220.

In an embodiment, the signal wiring 300 is disposed in the non-display region 120, the data line 100 is disposed in display region 110, and compared with a scheme that the connection wire 200 is disposed in the non-display region 120 in the related art, in the embodiments of the present disclosure, the connection wire 200 is disposed in the display region 110 so as to reduce an area of the non-display region 120 of the display panel 10, that is, to improve a proportion of the display region 110 in the display panel 10, whereby the narrow border effect of the display panel 10 is effectively ensured.

In an embodiment, referring to FIG. 1, the first connection wire 210 includes a first sub-subsection 210A and a first sub-wire 210B, and the second connection wire 220 includes a second sub-subsection 220A and a second sub-wire 220B. The sub-subsection and the sub-wire are configured to be connected to each other and intersect in an extension direction, whereby the data line 100 in the display region 110 and the signal wiring 300 in the non-display region 120 are electrically connected through the connection wire 200 in the display panel 10, and thus the normal transmission of the data signal is achieved. Further, since data signals have loss in the connection wires 200, and connection wires 200 with different lengths cause different losses, the first sub-subsection 210A, the first sub-wire 210B, the second sub-subsection 220A and the second sub-wire 220B are adjusted, so that various arrangement manners of the connection wire 200 are achieved, the diversity of the display panel 10 is improved, the signal transmitted in the display panel 10 is further prevented from having large loss, whereby the display effect of the display panel 10 is ensured.

In an embodiment, extension lengths of the first sub-subsection 210A, the first sub-wire 210B, the second sub-subsection 220A and the second sub-wire 220B are adjusted, so that resistances of the connection wires 200 at different positions are adjusted, total lengths of the connection wires 200 at different positions are balanced, that is, loss of signals transmitted by different connection wires 200 is balanced, and the overall display effect of the display panel 10 is improved. Lengths of the first sub-subsection 210A, the first sub-wire 210B, the second sub-subsection 220A and the second sub-wire 220B are L11, L12, L21, and L22, respectively, and referring to FIG. 1, if a length of the first sub-subsection 210A of the first connection wire 210 is greater than a length of the second sub-subsection 220A of the second connection wire 220, then a length of the first sub-wire 210B of the first connection wire 220B is adjusted to be less than a length of the second sub-wire 220B of the second connection wire 220, that is, $(L11-L21)\times(L12-L22)\leq0$ is satisfied. Conversely, if a length of the first sub-subsection 210A of the first connection wire 210 is less than a length of the second sub-subsection 220A of the second connection wire 220, then a length of the first sub-wire 210B of the first connection wire 220B is adjusted to be larger than a length of the second sub-wire 220B of the second connection wire 220, and $(L11-L21)\times(L12-L22)\leq0$ (not shown in the drawings) is still satisfied. Further, if a length of the first sub-subsection 210A of the first connection wire 210 is equal to a length of the second sub-subsection 220A of the second connection wire 220, then a length of the first sub-wire 210B of the first connection wire 220B is adjusted to also be equal to a length of the second sub-wire 220B of the second connection wire 220, and $(L11-L21)\times(L12-L22)\leq0$ (not shown in the drawings) is still satisfied. In other words, in different connection wires 200, if a length of the sub-subsection is relatively short, a length of the sub-wire is extended, so that the total lengths of the connection wires 200 at different positions are similar, the loss of the data signals transmitted by the connection wires 200 is balanced, and the display effect of the display panel 10 is ensured.

It should be noted that as shown in FIGS. 1 and 2, the display panel further includes a first center axis a, the first center axis passes through a center of the display panel, and an extension direction of the first center axis a is parallel to an extension direction of the data line. The first data line 100A and the second data line 100B may be located on different sides of the first center axis a, respectively, and correspondingly, the first connection wire 210 and the second connection wire 220 may be located on different sides of the first center axis a, respectively, and the first signal wiring 310 and the second signal wiring 320 may be located on different sides of the first center axis a, respectively, as shown in FIG. 1. Alternatively, the first data line 100A and the second data line 100B may be located on a same side of the first center axis a, and correspondingly, the first connection wire 210 and the second connection wire 220 may be located on a same side of the first center axis a, and the first signal wiring 310 and the second signal wiring 320 may be located on a same side of the first center axis a, as shown in FIG. 2. The specific arrangement positions of the data line 100, the connection wire 200 and the signal wiring 300 are not limited in the embodiments of the present disclosure.

It should be noted that the first center axis a is a virtual center axis, and it should be understood that the first center axis is a virtual line passing through the center of the display panel and substantially parallel to the extension direction of the data line.

In conclusion, according to the display panel provided in the embodiments of the present disclosure, the first connection wire includes the first sub-subsection and the first sub-wire, and the second connection wire includes the second sub-subsection and the second sub-wire. By adjusting the lengths of the first sub-subsection, the first sub-wire, the second sub-subsection and the second sub-wire, it is ensured that a total length difference between the first connection wire and the second connection wire is relatively small, and further, it is ensured that signals transmitted in different connection wires are balanced, a stable signal transmission of the display panel is ensured, and the display effect of the display panel is improved.

With continued referring to FIGS. 1 and 2, a resistance of the first connection wire is R1, a resistance of the second connection wire is R2, where |R2−R1|/R1≤20%.

In an embodiment, the connection wire 200 may be a metal wire, i.e., there is a resistance, and the signal wiring 300 transmitted to the data line 100 through the connection wire 200 may have a certain amount of signal loss due to its resistance value. Lengths of the first connection wire 210 and the second connection wire 220 Are adjusted to ensure that a total length of the first connection wire 210 is similar to a total length of the second connection wire 220, and thus to ensure that the resistance R1 of the first connection wire 210 is similar to the resistance R2 of the second connection wire 220, specifically, |R2−R1|/R1≤20%, such as, |R2−R1|/R1=0, or |R2−R1|/R1=5%, or |R2−R1|/R1=10%, or |R2−R1|/R1=20%, and a specific resistance value of the connection wire 200 is not limited in the embodiments of the present disclosure. The resistance value of the connection wire 200 is adjusted, so that a problem of different loss of transmitted data signals caused by a large difference of the resistance value of the connection wire 200 is solved, and the display effect of the display panel 10 is ensured.

Figure 3:
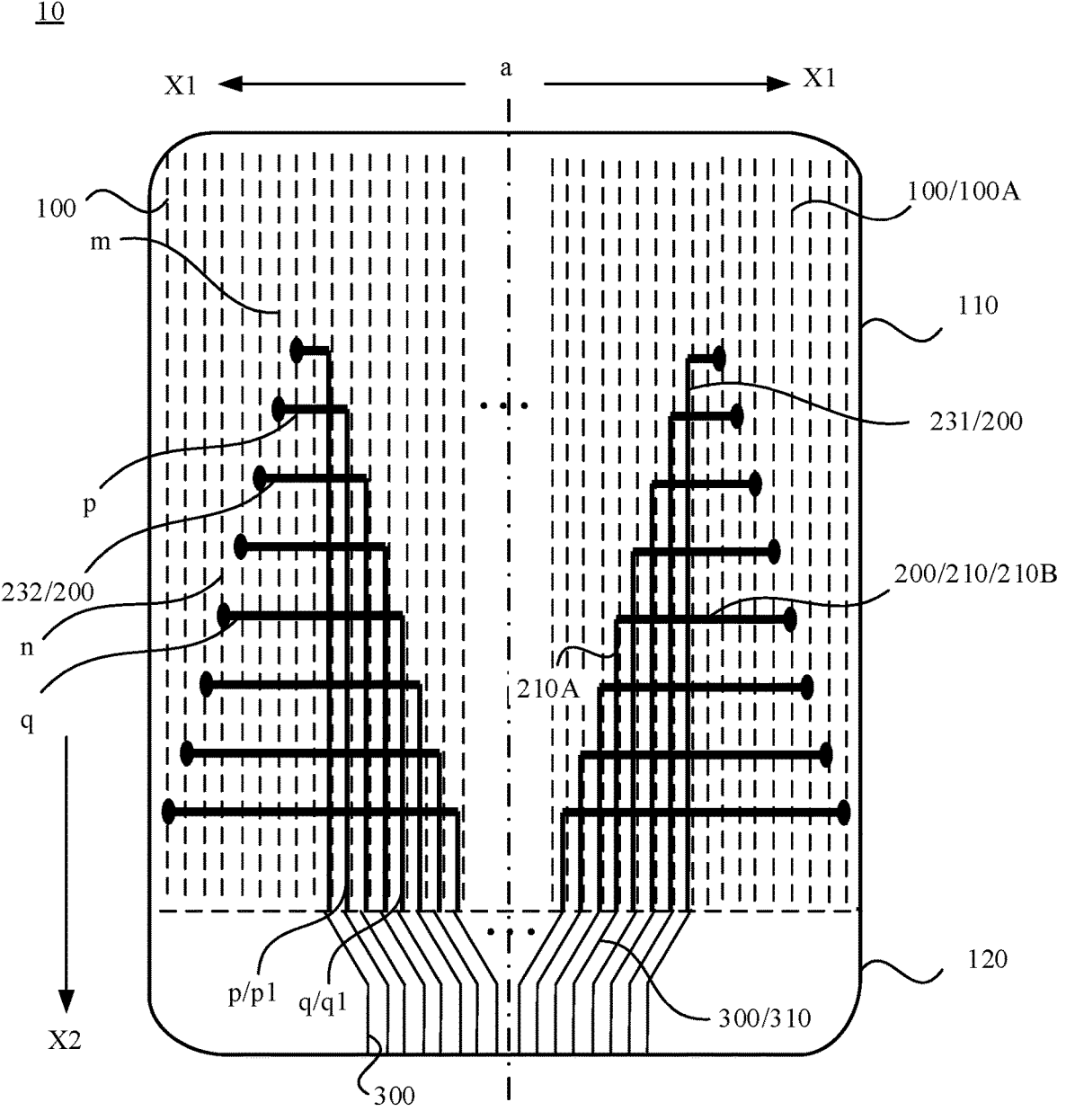
FIG. 3 is a schematic structural view of another display panel provided in an embodiment of the present disclosure.
Figure 4:
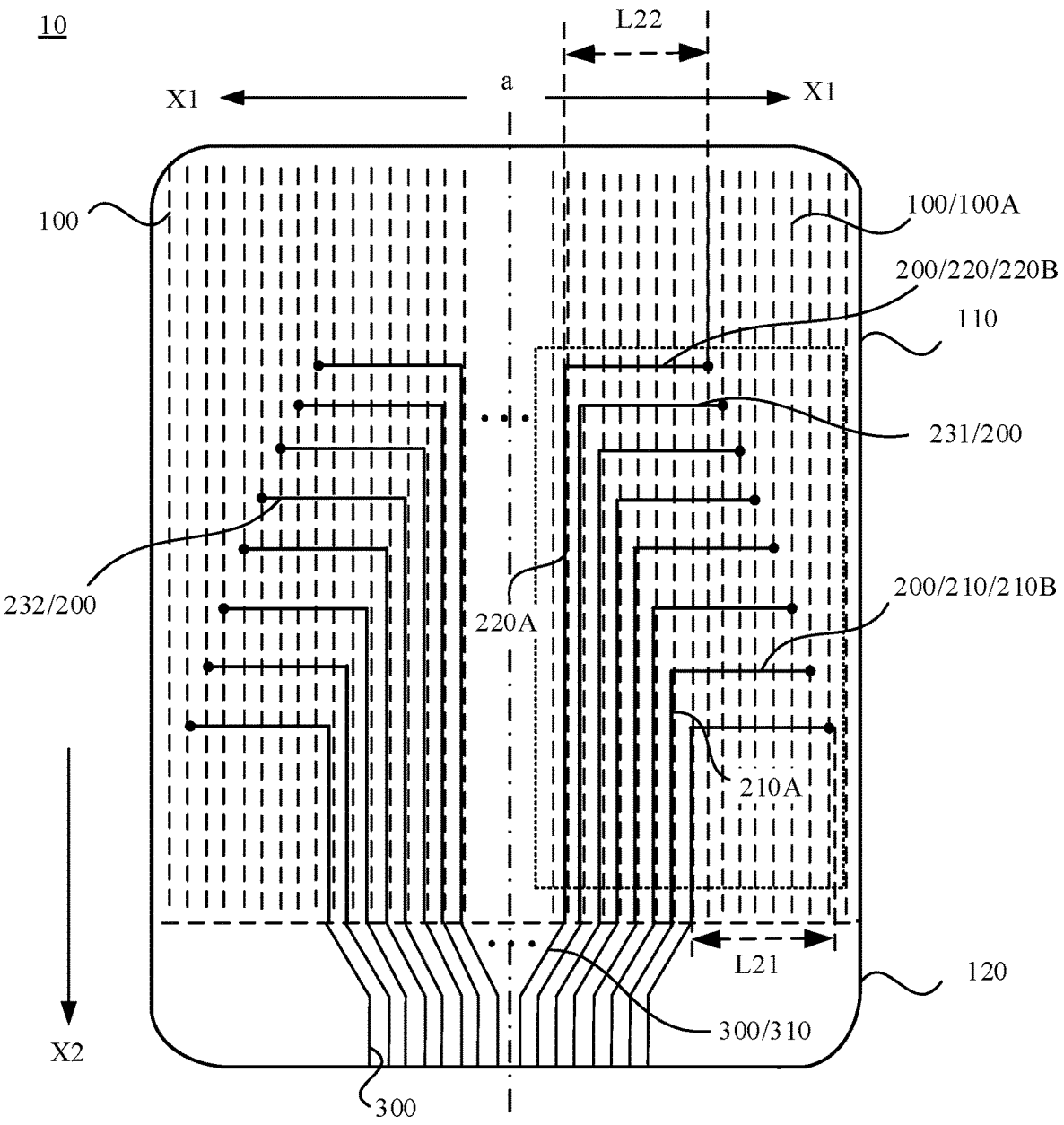
FIG. 4 is a schematic structural view of another display panel provided in an embodiment of the present disclosure.

FIG. 3 is a schematic structural view of another display panel provided in an embodiment of the present disclosure, FIG. 4 is a schematic structural view of another display panel provided in an embodiment of the present disclosure, and as shown in FIGS. 3 and 4, any one of the connection wires 200 includes a sub-subsection 231 and a sub-wire 232 which are connected to each other, and an extension direction of the sub-subsection 231 intersects an extension direction of the sub-wire 232; the display panel 10 further includes a first center axis a, and an extension direction of the first center axis a is parallel to an extension direction of the multiple data lines 100; and in the multiple connection wires 200 located on a same side of the first center axis a, an extension length of the first sub-subsection 210A is gradually increased in a direction X1 from the first center axis a to an edge of the display panel 10, and an extension length of the first sub-wire 210B is gradually increased in a direction X2 from the display region 110 to the non-display region 120.

Further, referring to FIG. 3, for multiple connection wires 200 on a same side of the first center axis a, when a length of the sub-subsection 231 facing away from the first center axis a is greater than a length of the sub-subsection 232 facing the first center axis a, a distance between the sub-wires 232 connected to the sub-subsection 231 with a larger length is relatively shorter, so that the total length balance of the connection wires 200 is ensured. An extension length of the first sub-subsection 210A is gradually increased along with the increase of the distance from the first center axis a. In order to ensure that total lengths of different connection wires 200 are similar, that is, when the extension length of the first sub-subsection 210A is gradually increased in the direction X1, the extension length of the first sub-wire 210B is gradually increased along with the decrease of the distance from the display region 120, whereby total lengths of the connection wires 200 at different positions are similar, a problem that transmitted data signal losses are different due to a fact that different connection wires 200 are large in a resistance value difference due to a large length difference is solved, and thus the display effect of the display panel 10 is ensured.

Further, in the multiple connection wires 200 disposed to be located on the same side of the first center axis a, the extension length of the first sub-subsection 210A is gradually increased in the direction X1 from the first center axis a to the edge of the display panel 10, and the extension length of the first sub-wire 210B is gradually increased in the direction X2 from the display region 110 to the non-display region 120; therefore, lengths of the first sub-subsection 210A and the first sub-wire 210B are gradually changed, and the light reflection of the wires at different regions is also gradually changed, so that the display problem due to the sudden reflection caused by a sudden change of the lengths of the first sub-subsection 210A and/or the first sub-wire 210B is avoided, and thus a good display effect is ensured.

In an embodiment, referring to FIG. 4, in the multiple connection wires 200 disposed to be located on the same side of the first center axis a, the extension length of the first sub-subsection 210A is gradually reduced in the direction X1 from the first center axis a to the edge of the display panel 10, while in the direction X2 from the display region 110 to the non-display region 120, the extension length of the first sub-wire 210B is adjusted, for example, the length of the first sub-wire 210B of the first connection wire 220B is adjusted to be the same as the length of the second sub-wire 220B of the second connection wire 220, i.e., L12−L22=0, so that (L11−L21)×(L12−L22)≤0 is still satisfied. Therefore, the total length of the first connection wire 210 and the total length of the second connection wire 220 Are ensured to be similar, and thus the display effect of the display panel is ensured.

In an embodiment, on the basis that the connection wire includes the first connection wire and the second connection wire, the connection wire may further include a parallel wire, and the parallel wire is electrically connected to the first connection wire and the second connection wire and disposed on different layers (not specifically shown in the drawings), for reducing the transmission resistance of the connection wire. The parallel wire includes parallel sub-subsections and parallel sub-wires, the parallel sub-subsections and the sub-subsections are connected in parallel and disposed on different layers, the parallel sub-wires and the sub-wires are connected in parallel and disposed on different layers, and an extension direction of the parallel wire is the same as an extension direction of the connection wire connected in parallel to the parallel wire, and an arrangement position of the parallel wire is not specifically limited in the embodiments of the present disclosure. The parallel wire is added, so that the transmission resistance of the connection wire in the display panel is reduced, the signal transmission effect of the display panel is ensured, and thus the display effect of the display panel is ensured.

With continued reference to FIG. 3, the connection wire 200 includes a p-th connection wire 200 (shown as p in the drawings) and a q-th connection wire 200 (shown as q in the drawings), and the data line 100 includes an m-th data line 100 (shown as m in the drawings) and an n-th data line 100 (shown as n in the drawings), the p-th connection wire 200 (shown as p in the drawings), the q-th connection wire 200 (shown as q in the drawings), the m-th data line 100 (shown as m in the drawings) and the n-th data line 100 (shown as n in the drawings) are located on a same side of the first center axis a; where p/q and p and q are both positive integers, and m≠n and m and n are both positive integers; the p-th connection wire 200 (shown as p in the drawings) is electrically connected to the m-th data line 100 (shown as m in the drawings), and the q-th connection wire 200 (shown as q in the drawings) is electrically connected to the n-th data line 100 (shown as n in the drawings); and a first sub-subsection p1 of the p-th connection wire 200 (shown as p in the drawings) is located on a side, facing away from the first center axis a, of a first sub-subsection q1 of the q-th connection wire 200 (shown as q in the drawings); and the m-th data line 100 (shown as m in the drawings) is located on a side of the n-th data line 100 (shown as n in the drawings) facing the first center axis a.

Referring to FIG. 3, the display panel 10 includes multiple connection wires 200, and a p-th connection wire 200 (shown as p in the drawings) and a q-th connection wire 200 (shown as q in the drawings) are exemplified as an example in FIG. 3. The p-th connection line 200 (shown as p in the drawings) and the q-th connection line 200 (shown as q in the drawings) are both located on a same side of the first center axis a in the display panel 10, and the first sub-subsection p1 of the p-th connection line 200 (shown as p in the drawings) is further facing away from a side of the first center axis a than the first sub-subsection q1 of the q-th connection line 200 (shown as q in the drawings), and the m-th data line 100 (shown as m in the drawings) electrically connected to the p-th connection line 200 (shown as p in the drawings) is closer to a side of the first center axis a than the n-th data line 100 (shown as n in the drawings) electrically connected to the q-th connection line 200 (shown as q in the drawings).

In other words, an extension length of the sub-subsection 231 is increased in the direction from the first center axis a to the edge of the display panel 10, and lengths of the sub-wires 232 connected to the data lines 100 are increased in the direction from the display region 110 to the non-display region 120, so that a total length of the connection wire 200 is adjusted, and the lengths of the connection wires 200 on a same side of the first center axis a are ensured to be the same or similar, and then resistances on the connection wires 200 are ensured to be the same or similar, that is, losses of data signals on the connection wires 200 are the same or similar, and thus the display effect of the display panel 10 is ensured.

With continued reference to FIG. 3, the first sub-subsection 210A and the first sub-wire 210B are disposed on different layers.

In an embodiment, the first sub-subsection 210A and the first sub-wire 210B in the connection wire 200 are both used for a data signal transmission, in order to avoid a condition that the first sub-subsection 210A and the first sub-wire 210B in the connection wire 200 are short-circuited, the first sub-subsection 210A and the first sub-wire 210B are arranged in different layers, namely, the sub-subsection 231 and the sub-wire 232 are disposed on different layers, and thus the stability of the signal transmission of the display panel 10 is ensured.

Figure 5:
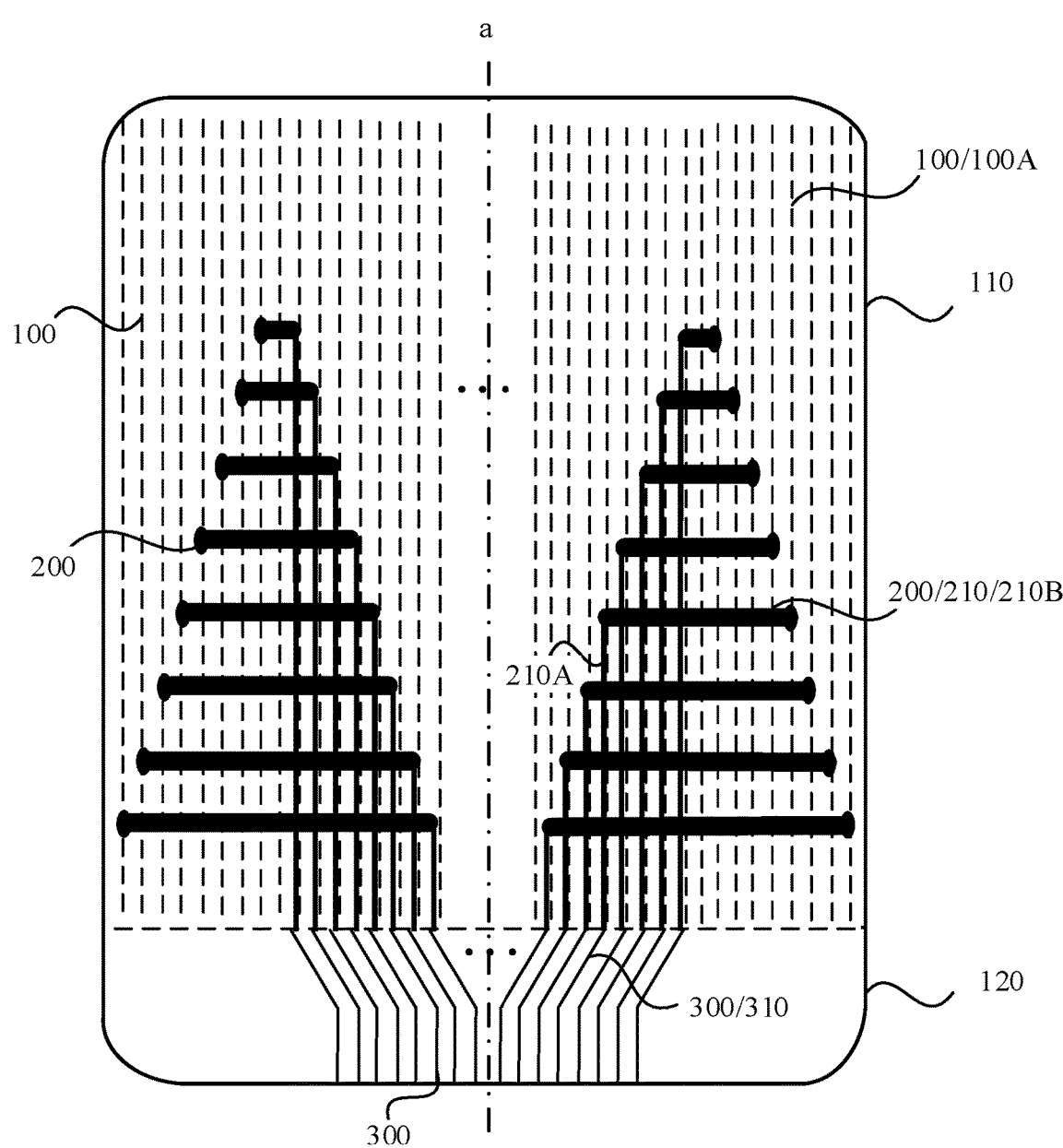
FIG. 5 is a schematic structural view of another display panel provided in an embodiment of the present disclosure.

FIG. 5 is a schematic structural view of another display panel provided in an embodiment of the present disclosure, referring to FIG. 5, the first sub-subsection 210A and the data line 100 are disposed on a same layer, an extension direction of the first sub-subsection 210A is parallel to an extension direction of the data line 100, and an extension direction of the first sub-wire 210B intersects the extension direction of the data line 100, and a line width of the first sub-wire 210B is greater than a line width of the first sub-subsection 210A.

The first connection wire 210 includes a first sub-subsection 210A and a first sub-wire line 210B, specifically, the first sub-subsection 210A and the data line 100 are disposed on a same layer, and the extension direction of the first sub-subsection 210A is parallel to the extension direction of the data line 100, namely, a relative area of the first sub-subsection 210A and the data line 100 is larger. The extension direction of the first sub-wire 210B intersect the extension direction of the data line 100, namely, a relative area of the first sub-wire 210B and the data line 100 is smaller.

When the display panel 10 performs a signal transmission, the first sub-subsection 210A is prone to generating crosstalk with the data line 100 compared with the first sub-wire 210B, the crosstalk generated with the data line 100 is adjusted by adjusting line widths of the first sub-wire 210B and the first sub-subsection 210A, specifically, the line width of the first sub-wire 210B is greater than the line width of the first sub-subsection 210A, the crosstalk generated between the data line 100 and the connection wire 200 in the extension direction of the data line 100 of the display panel 10 is reduced, and the stability of the signal transmission of the display panel 10 is ensured. Further, in order to avoid the crosstalk, the line width of the first sub-subsection 210A is set to be small, but the resistance in the connection wire 200 exists, that is, the line width of the first sub-wire 210B is set to be large, so that an overall resistance value of the connection wire 200 is ensured to be small, an overall resistance value of the display panel 10 is ensured to be small, and thus the display effect of the display panel 10 is ensured.

Figure 6:
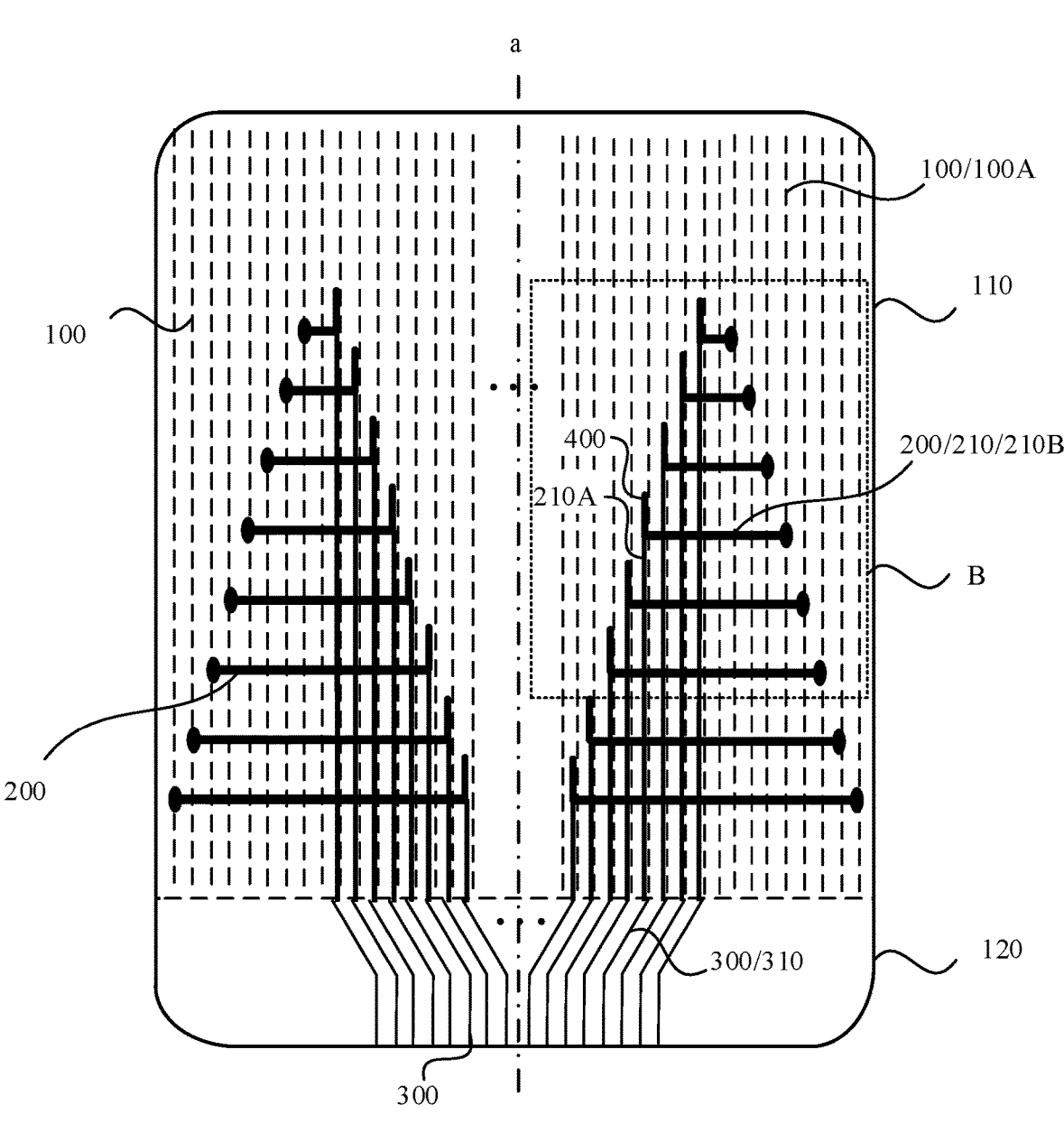
FIG. 6 is a schematic structural view of another display panel provided in an embodiment of the present disclosure.
Figure 7:
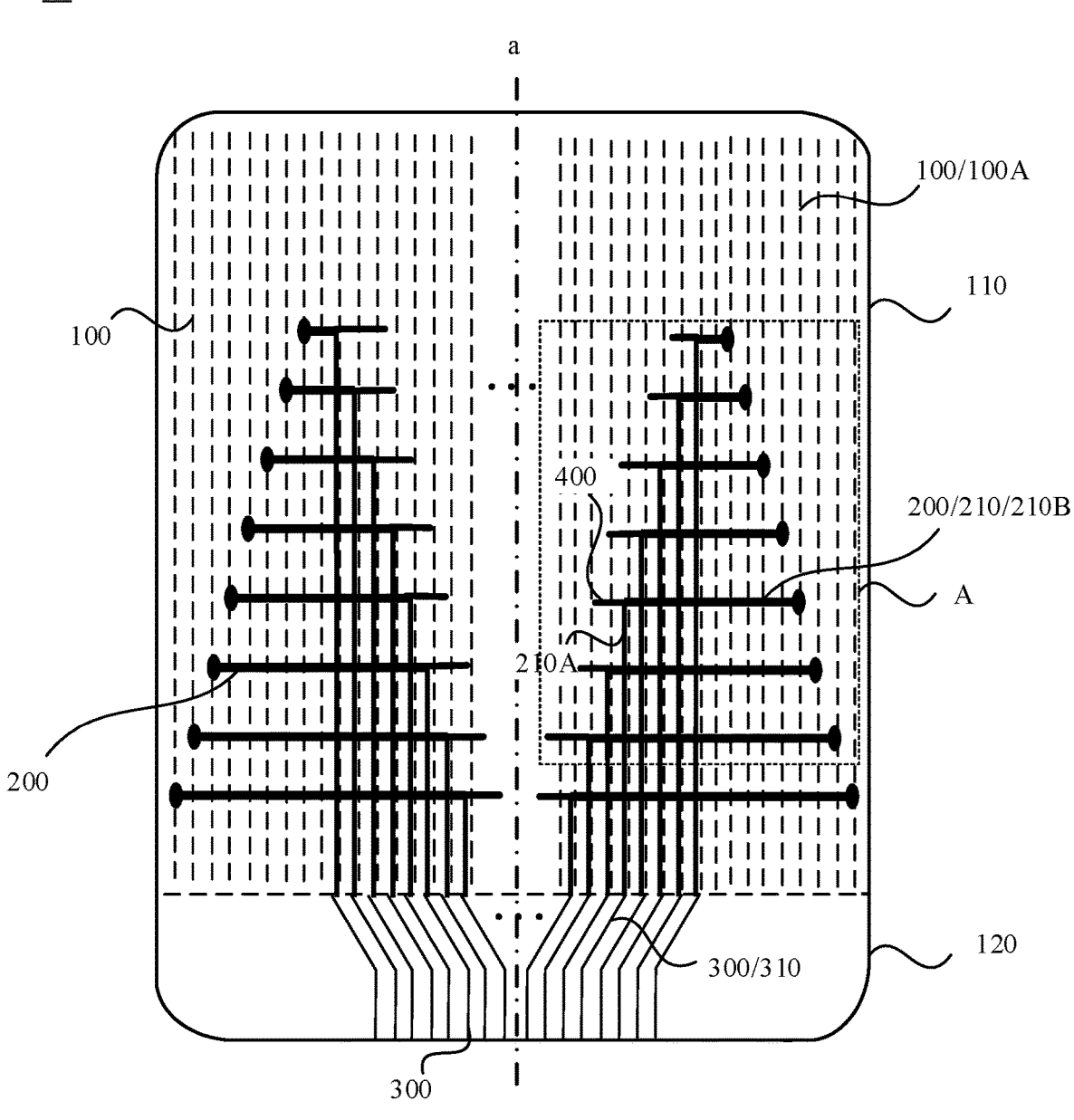
FIG. 7 is a schematic structural view of another display panel provided in an embodiment of the present disclosure.
Figure 8:
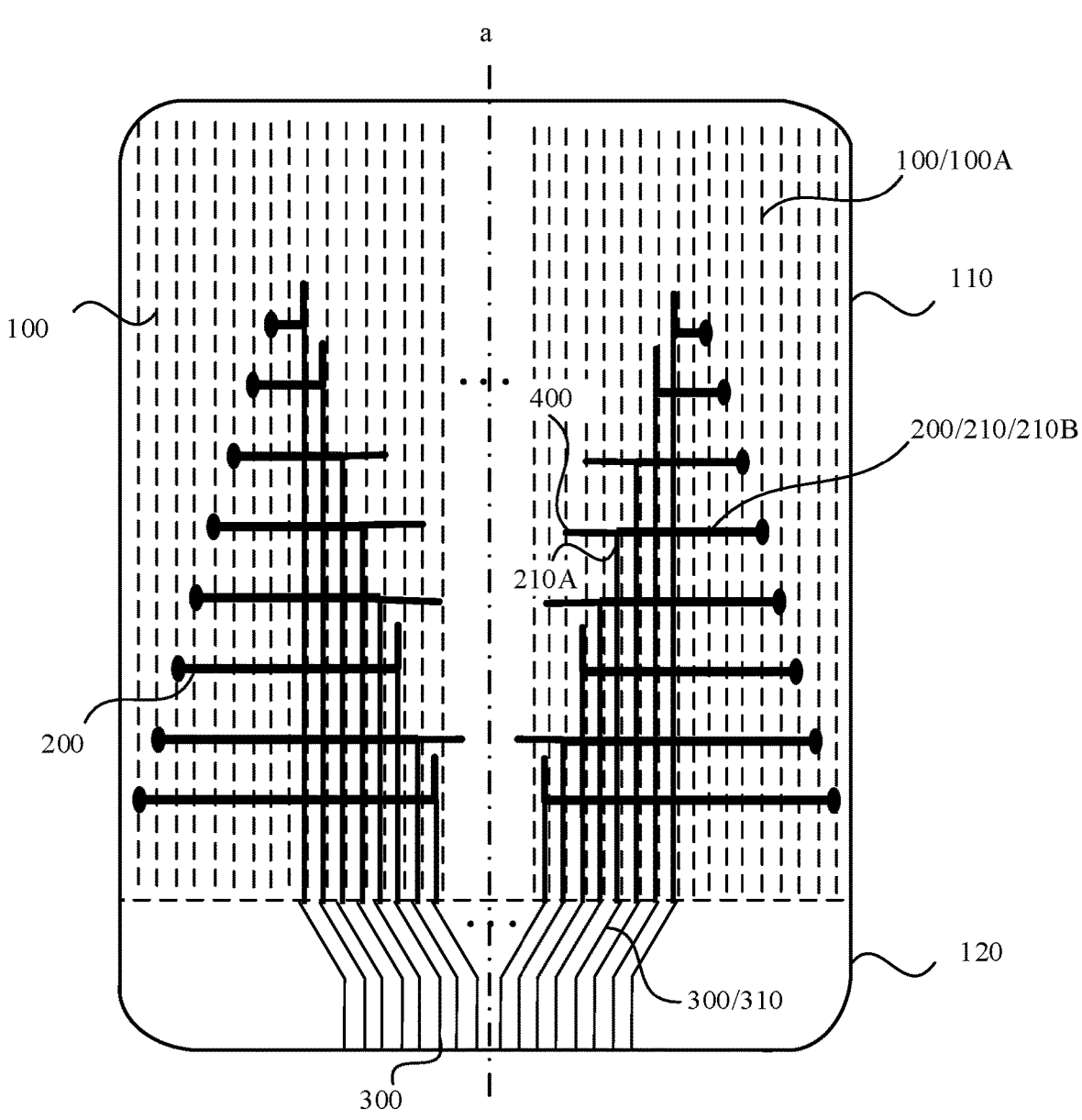
FIG. 8 is a schematic structural view of another display panel provided in an embodiment of the present disclosure.
Figure 9:
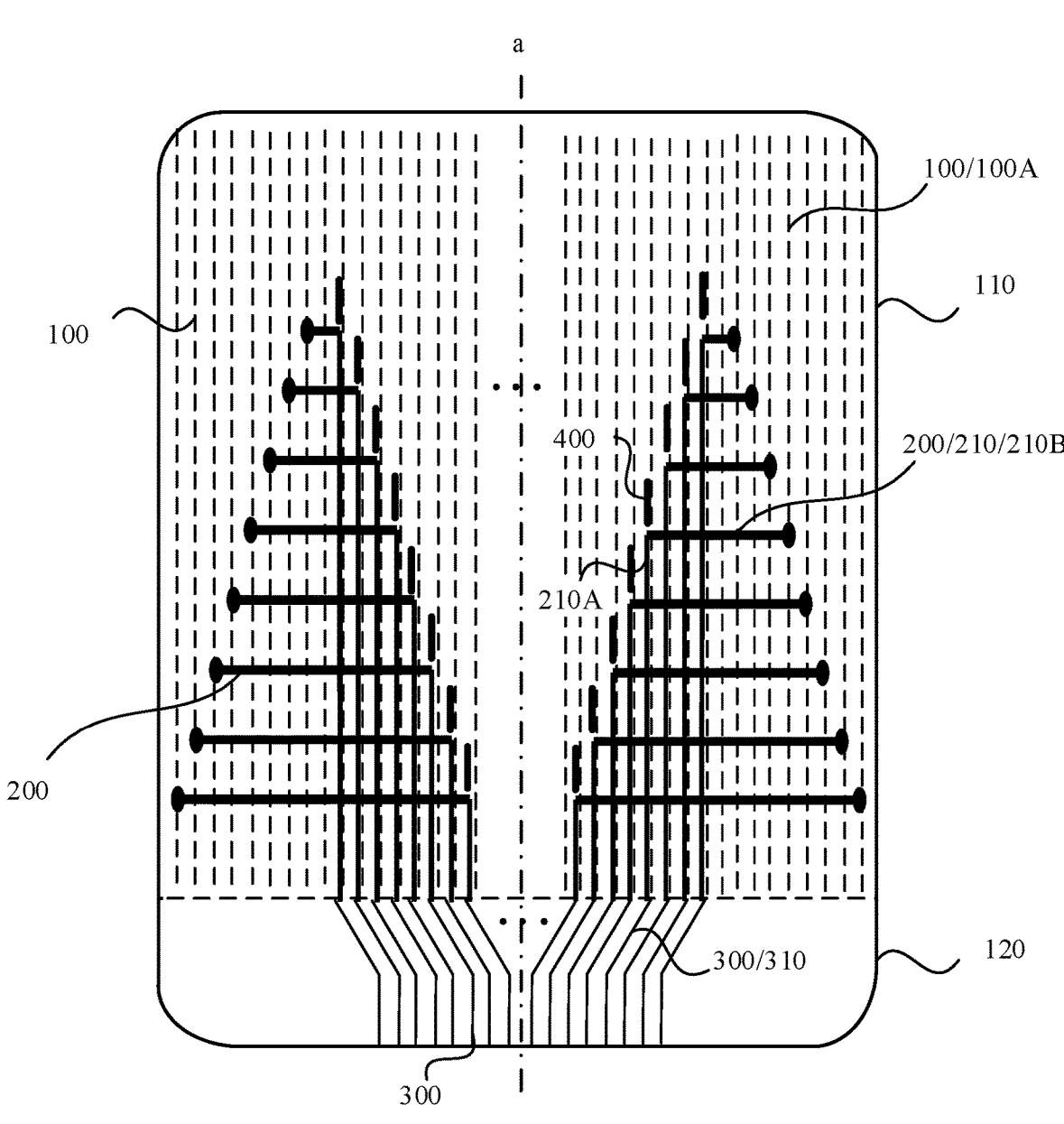
FIG. 9 is a schematic structural view of another display panel provided in an embodiment of the present disclosure.

FIG. 6 is a schematic structural view of another display panel provided in an embodiment of the present disclosure, FIG. 7 is a schematic structural view of another display panel provided in an embodiment of the present disclosure, FIG. 8 is a schematic structural view of another display panel provided in an embodiment of the present disclosure, and FIG. 9 is a schematic structural view of another display panel provided in an embodiment of the present disclosure. Referring to FIGS. 6 to 9, the display panel 10 further includes a first center axis a, an extension direction of which is parallel to an extension direction of the data line 100; the display panel 10 further includes a virtual wire 400, and the virtual wire 400 is disposed on a side of the first sub-subsection 210A facing away from the non-display region 120, and/or, the virtual wire 400 is disposed on a side of the first sub-wire 210B facing the first center axis a.

The display panel 10 further includes a virtual wire 400, and the virtual wire 400 does not affect a normal signal transmission in the display panel 10. Referring to FIGS. 6 to 9, the virtual wire 400 is disposed on a side of the first sub-subsection 210A facing away from the non-display region 120 and/or on a side of the first sub-wire 210B facing the first center axis a, and is proximate to or in contact with the connection wires 200 on both sides.

In an embodiment, the connection wire 200 is exemplified by a first connection wire 210, the first connection wire 210 includes a first sub-subsection 210A and a first sub-wire 210B. The virtual wire 400 may be disposed on a side of the first sub-subsection 210A facing away from the display region 120, referring to FIGS. 6 and 9. Referring to FIG. 7, the virtual wire 400 may also be disposed on a side of the first wire 210B facing the first center axis a. The multiple virtual wires 400 may be disposed simultaneously on a side of the first sub-subsection 210A facing away from the display region 120 and on a side of the first wire 210B facing the first center axis a, referring to FIG. 8, that is, the virtual wires 200 may be disposed in a variety. The resistance difference existing in a transmission process of the connection wire 200 may be balanced by disposing the virtual wire 400, and the stability of signal transmission of the display panel 10 is ensured. Further, the length of the connection wire 200 may be further compensated by setting the virtual wire 400, namely, the overall wiring balance of a setting region of the connection wire 200 is achieved by setting the virtual wire 400, and the density balance of the wiring setting of different regions is ensured; therefore, different light reflectivity in different regions of the display panel 10 due to unbalanced wire arrangement is avoided, and a situation that the display effect of the display panel 10 is unbalanced is avoided.

With continued reference to FIG. 9, the virtual wire 400 and the connection wires 200 are disposed in an insulated manner, and the virtual wire 400 is electrically connected to a fixed potential signal terminal.

The virtual wire 400 and the connection wire 200 are disposed in the insulated manner, so that the virtual wire 400 is prevented from interfering signals transmitted in the connection wire 200.

Further, in order to avoid that a normal transmission of display signals is affected by other signals induced when the virtual wire 400 is disposed in a floating manner, a potential adjustment may be performed on the virtual wire 400, for example, the virtual wire 400 is electrically connected to a fixed potential terminal, so that on one hand, a fixed potential signal is transmitted on the virtual wire 400, the potential is not affected by other signals, and other signals are not interfered; and on the other hand, when the virtual wire 400 is electrically connected to the fixed potential terminal, the resistance loss in a signal transmission process of the wire of the fixed signal terminal may be reduced, and the signal transmission effect in the display panel 10 is improved.

It should be noted that the arrangement position of the fixed potential terminal is not specifically limited in the embodiments of the present disclosure, and the fixed potential terminal may be a positive voltage signal or a negative voltage signal.

With continued reference to FIGS. 6 to 8, the virtual wire 400 and the connection wires 200 are located on a same layer and are connected to each other.

The virtual wire 400 and the connection wire 200 are disposed on a same layer, so that the thickness of the display panel 10 may be reduced, and the thin design of the display panel 10 may be conveniently achieved. Further, on the basis of the same layer, the virtual wire 400 and the connection wire 200 may be integrally designed, so that the preparation process of the display panel 10 may be reduced, and the cost is saved. Further, the virtual wire and the connection wire 200 are integrally disposed on a same layer, a via hole between the connection wire 200 and the data line 100 may be prevented from being formed in the edge position of the connection wire 200, and thus the stability of a punching connection may be ensured.

Figure 10:
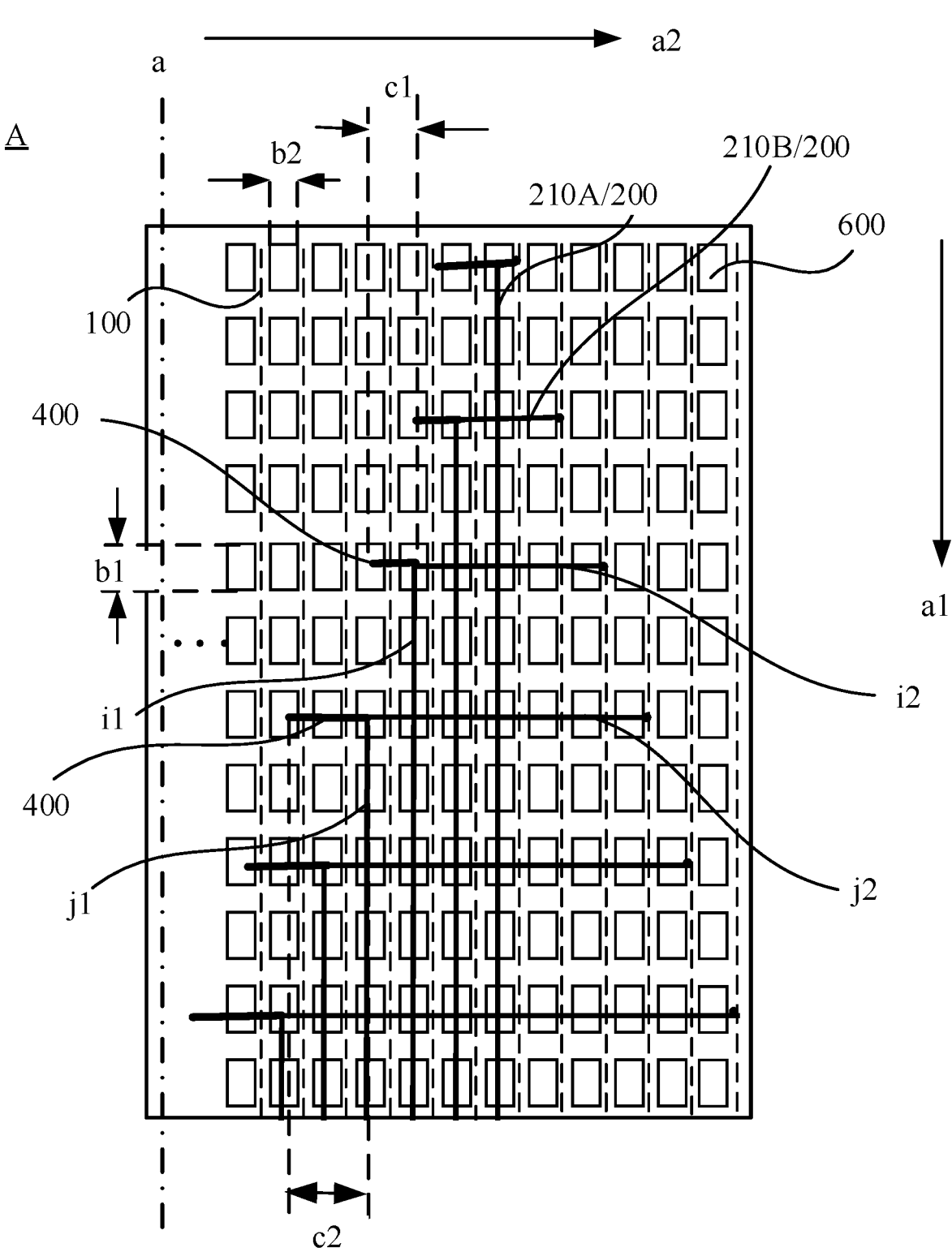
FIG. 10 is an enlarged schematic view of an A region in FIG. 7.
Figure 11:
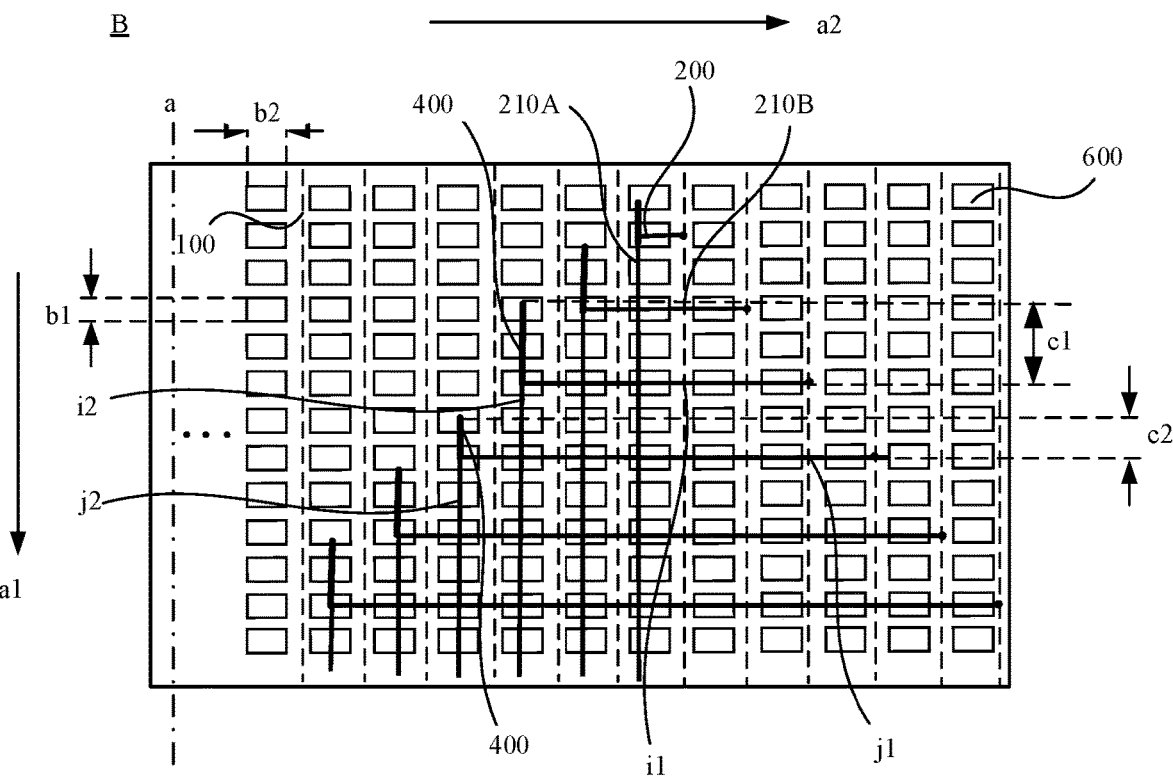
FIG. 11 is an enlarged schematic view of a B region in FIG. 6.

FIG. 10 is an enlarged schematic view of an A region in FIG. 7, FIG. 11 is an enlarged schematic view of a B region in FIG. 6. Referring to FIGS. 10 and 11, the display panel 10 further includes multiple sub-pixels 600 in the display region 110, the multiple sub-pixels 600 are arranged in an array; the multiple connection wires 200 include an i-th connection wire 200 (shown as i in the drawings) and a j-th connection wire 200 (shown as j in the drawings), the i-th connection wire 200 (shown as i in the drawings) includes an i-th sub-subsection i1 and an i-th sub-wire i2, and the j-th connection wire 200 (shown as j in the drawings) includes a j-th sub-subsection j1 and a j-th sub-wire j2; the i-th sub-subsection i1 is located on a side of the j-th sub-subsection j1 facing away from the first center axis a, and the i-th sub-wire i2 is located on a side of the j-th sub-wire j2 facing away from the non-display region 120; n columns of sub-pixels are disposed between the i-th sub-subsection and the j-th sub-subsection, and n rows of sub-pixels are disposed between the i-th sub-wire and the j-th sub-wire; a size of the sub-pixels 400 in a first direction a1 is a first size b1, a size of the sub-pixels 400 in a second direction a2 is a second size b2, the first direction a1 is parallel to the extension direction of the data lines 100, and the second direction a2 is perpendicular to the extension direction of the data lines 100; in a case where the first size b1 is greater than the second size b2, an extension length c1 of the virtual wire 400 connected to the i-th sub-wire i2 is less than an extension length c2 of the virtual wire 400 connected to the j-th sub-wire j2; and in a case where the first size b1 is less than the second size b2, an extension length c1 of the virtual wire 400 connected to the i-th sub-subsection i1 is greater than an extension length c2 of the virtual wire 400 connected to the j-th sub-subsection j1.

The display region 110 includes multiple array sub-pixels 600, the sub-pixels 600 display and emit light through display signals provided by display signal lines, and then the display function of the display panel 10 is achieved. Exemplarily, the sub-pixel 600 includes a red sub-pixel, a green sub-pixel and a blue sub-pixel, and the type and arrangement of the sub-pixels 600 are not specifically limited in the embodiments of the present disclosure.

Referring to FIG. 10 and FIG. 11, the display panel 10 includes multiple connection wires 200, and in FIG. 10 and FIG. 11, the i-th connection wire 200 (shown as i in the drawings) and the j-th connection wire 200 (shown as j in the drawings) on a side of the first central axis a are exemplified as an example. The i-th sub-subsection i1 of the i-th connection wire 200 (shown as i in the drawings) is further facing away from a side of the first center axis a than the j-th sub-subsection j1 of the j-th connection wire 200 (shown as j in the drawings), and the i-th sub-wire i2 of the i-th connection wire 200 (shown as i in the drawings) is further facing away from the non-display region 120 than the j-th sub-subsection j2 of the j-th connection wire 200 (shown as j in the drawings). In the arrangement manner of the above-described connection wires 200, n rows and n columns of sub-pixels 600 exist between different connection wires 200, the numerical value of n is not specifically limited in the embodiments of the present disclosure, and the sub-pixels may have different sizes in the row direction (a2 direction as shown in the drawings) and the column direction (a1 direction as shown in the drawings), so that a difference between extension lengths of the i-th sub-subsection i1 and the j-th sub-subsection j1 may be different from a difference between extension lengths of the i-th sub-wire i2 and the j-th sub-wire j2, so that the loss in a data signal transmission process may be different, and the signal loss on different connection wires may be adjusted by adjusting the length of the virtual wire 400.

In an embodiment, the first direction a1 is parallel to the extension direction of the data lines 100, that is, the first direction a1 is a direction from the display region 110 to the non-display region 120, and the second direction a2 is perpendicular to the extension direction of the data lines 100, that is, the second direction a2 may be an arrangement direction of the data lines 100. A size of the sub-pixel 600 in the first direction a1 is a first size b1, and a size of the sub-pixel 600 in the second direction a2 is a second size b2. Based on a size relation between the first dimension b1 and the second dimension b2, a change in a length between the first sub-subsection 210A and the first sub-wire 210B in the connection wire 200 is achieved, that is, the size of the added virtual wire 400 is correspondingly changed, and the display effect of the display panel 10 is further ensured.

Exemplarily, when the first dimension b1 is greater than the second dimension b2, referring to FIG. 9, an extension length c1 of the virtual wire 400 connected to the i-th sub-subsection i1 is greater than an extension length c2 of the virtual wire 400 connected to the j-th sub-subsection j1. When the first dimension b1 is less than the second dimension b2, referring to FIG. 10, the extension length c1 of the virtual wire 400 connected to the i-th sub-subsection i1 is greater than the extension length c2 of the virtual wire 400 connected to the j-th sub-subsection j1. In other words, the length difference of the connection wires 200 caused by a size difference of the sub-pixel 600 in the first direction a1 and the second direction a2 is adjusted according to the length of the virtual wire 400, the length of the connection wires 200 is further adjusted, it is ensured that the lengths of the connection wires 200 on the same side of the first center axis a are the same or similar, that is, the resistances on the connection wires 200 are the same or similar, and the loss of the data signal on the connection wire 200 is the same or similar, so that the display effect of the display panel 10 is ensured.

Figure 12:
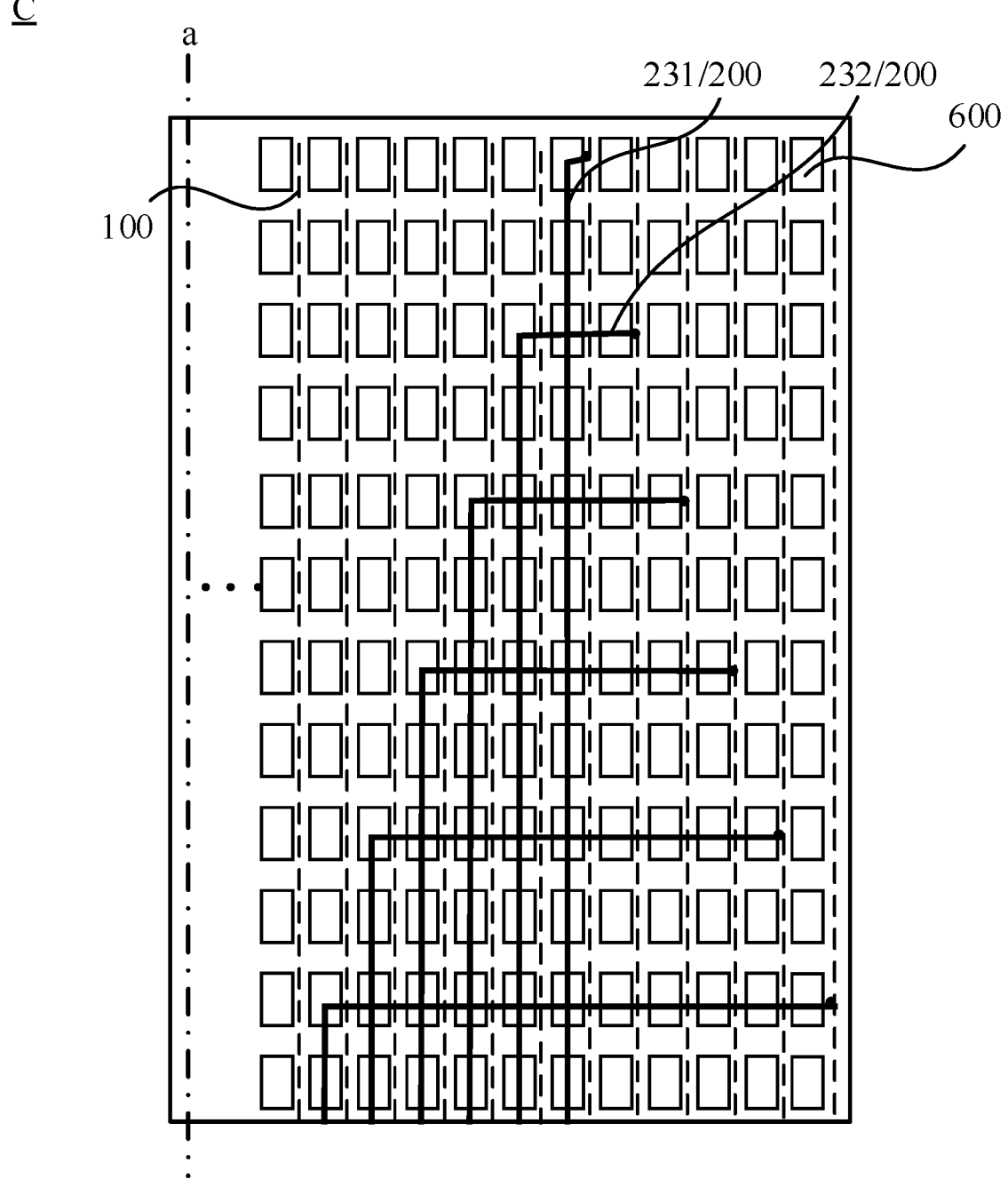
FIG. 12 is a schematic structural view of a display region provided in an embodiment of the present disclosure.
Figure 13:
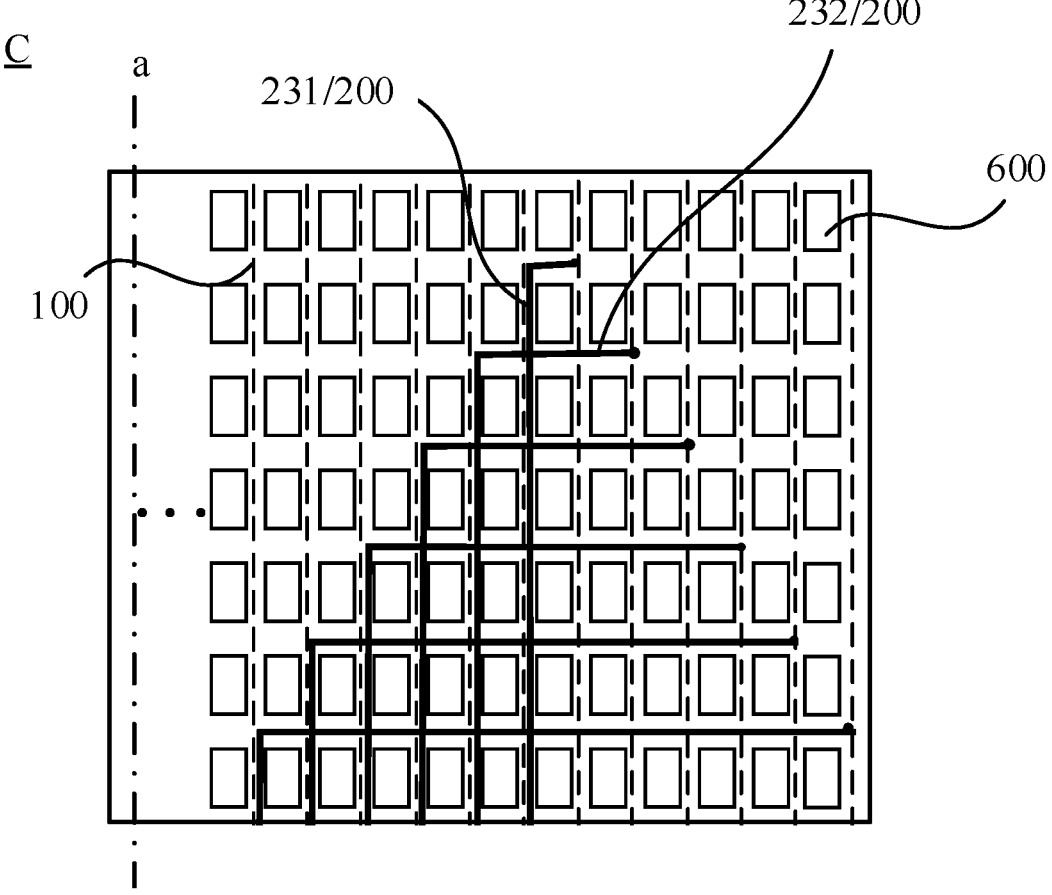
FIG. 13 is a schematic structural view of another display region provided in an embodiment of the present disclosure.

FIG. 12 is a schematic structural view of a display region provided in an embodiment of the present disclosure, FIG. 13 is a schematic structural view of another display region provided in an embodiment of the present disclosure, as shown in FIG. 12 and FIG. 13, any one of the connection wires 200 includes a sub-subsection 231 and a sub-wire 232 which are connected to each other, and an extension direction of the sub-subsection 231 intersects an extension direction of the sub-wire 232; the display panel 10 further includes multiple sub-pixels 300 arranged in array; and at least one column of sub-pixels are disposed in two adjacent sub-subsections 231, and/or at least one row of sub-pixels are disposed in two adjacent sub-wires 232.

The display region 110 includes multiple array sub-pixels 600, the sub-pixels 600 display and emit light through display signals provided by display signal lines, and then the display function of the display panel 10 is achieved. Exemplarily, the sub-pixel 600 includes a red sub-pixel, a green sub-pixel and a blue sub-pixel, and the type and arrangement of the sub-pixels 600 are not specifically limited in the embodiments of the present disclosure.

At least one row of sub-pixels 600 is disposed between any two adjacent sub-wires 232, exemplarily, referring to FIG. 12, the sub-wires 232 may be located between two adjacent rows of sub-pixels 600, in this case, at least one row of sub-pixels 600 may be disposed between two adjacent sub-wires 232, referring to FIG. 12, there is overlap between the sub-wires 232 and the sub-pixels 600 in a thickness direction (not shown in the drawing) of the display panel 10, in this case, at least one row of sub-pixels 600 may be disposed between two adjacent sub-wires 232. Further, at least one column of sub-pixels 600 is disposed between any two adjacent sub-wires 232, exemplarily, referring to FIG. 13, the sub-subsection 231 may be located between two adjacent columns of sub-pixels 600, in this case, at least one column of sub-pixels 600 may be disposed between two adjacent sub-subsections 231, referring to FIG. 11, there is overlap between the sub-subsections 231 and the sub-pixels 600 in a thickness direction (not shown in the drawing) of the display panel 10, and in this case, at least one column of sub-pixels 600 may be disposed between two adjacent sub-subsections 231. By the adoption of the arrangement manner described above, a centralized arrangement of the sub-subsection 231 and the sub-wire 232 of the connection wire 200 is avoided, and a situation that the display effect of the display panel 10 is affected due to a fact that the display panel 10 is low in brightness or non-uniform in reflection under the screen-off condition is avoided.

Figure 14:
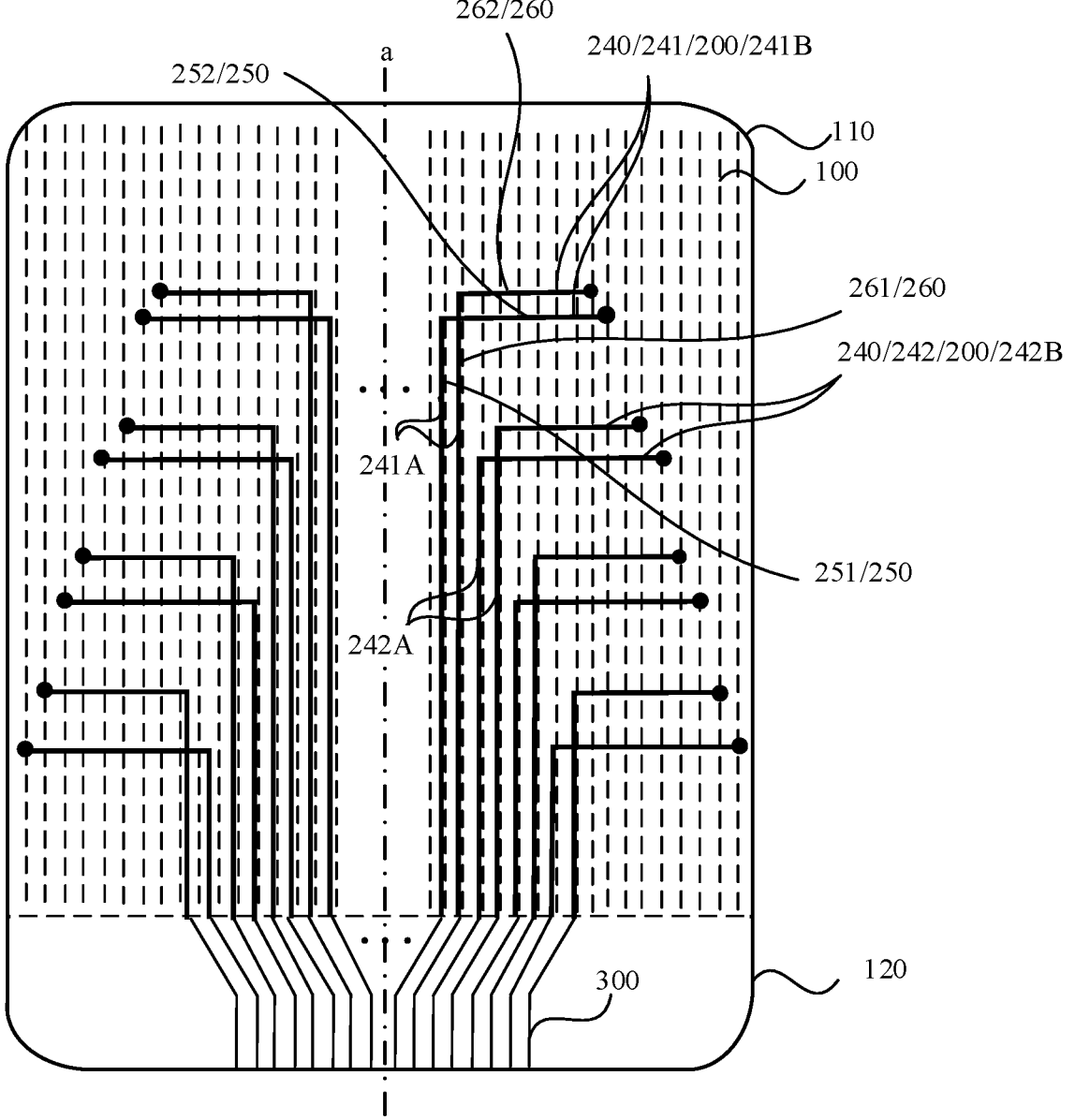
FIG. 14 is a schematic structural view of another display panel provided in an embodiment of the present disclosure.

FIG. 14 is a schematic structural view of another display panel provided in an embodiment of the present disclosure, and referring to FIG. 14, the display panel 10 further includes a first center axis a, an extension direction of the first center axis a is parallel to an extension direction of the multiple data lines 100; and the display panel 10 includes multiple connection wire groups 240, and each connection wire group 2401 of the multiple connection wire groups includes two connection wires 200; any two connection wire groups 240 among the multiple connection wire groups include a first connection wire group 241 and a second connection wire group 242, and the sub-subsection 241A in the first connection wire group 241 is located on a side, facing the first center axis a, of the sub-subsection 242A in the second connection wire group 242, and the sub-wire 241B in the first connection wire group 241 is located on a side, facing away from the non-display region 120, of the sub-wire 242B in the second connection wire group 242; and a same connection wire group 240 among the multiple connection wire groups includes a third connection wire 250 and a fourth connection wire 260, and the sub-subsection 251 in the third connection wire 250 is located on a side, facing the first center axis a, of the sub-subsection 261 in the fourth connection wire 260; and the sub-wire 252 in the third connection wire 250 is located on a side, facing the non-display region 120, of the sub-wire 262 in the fourth connection wire 260.

The display panel 10 includes the multiple connection wire groups 240, and referring to FIG. 14, two connection wire groups 240, namely a first connection wire group 241 and a second connection wire group 242, are exemplified as an example. The sub-subsection 241A in the first connection wire group 241 is closer to the side of the first center axis a than the sub-subsection 242A in the second connection wire group 242, and meanwhile, the sub-wire 241B in the first connection wire group 241 is further facing from the side of the non-display region 120 than the sub-wire 242B in the second connection wire group 242. In other words, a setting tendency of the multiple connection wire groups 240 in the display panel 10 is that: the sub-wire in the connection wire group 240 are further facing away from the non-display region 120, the sub-subsection in the connection wire group 240 is closer to the first central axis a.

Further, the connection wire group 240 includes two connection wires 200, referring to FIG. 14, two connection wires 200, namely a third connection wire 250 and a fourth connection wire 260, are exemplified as an example. The sub-subsection 251 in the third connection wire 250 is closer to the side of the first center axis a than the sub-subsection 261 in the fourth connection wire 260, and meanwhile, the sub-wire 252 of the third connection wire 250 is closer to the side of the non-display region 120 than the sub-wire 262 in the fourth connection wire 260, in other words, a setting tendency of the two connection wires 200 within each connection wire group 240 is that: in the connection wire group 240, the sub-subsection of the connection wire 200 is closer to the first central axis a, and the sub-wire of the connection wire 200 is closer to the non-display region 120. Through the crossed arrangement of the connection wires 200, the regular arrangement of the connection wires 200 in the display panel 10 is avoided, that is, the regular change of resistance in the connection wires 200 is broken, it is ensured that the change is not easy to see on the whole of the total vision of the display panel 10, and the display effect of the display panel 10 is improved.

Figure 15:
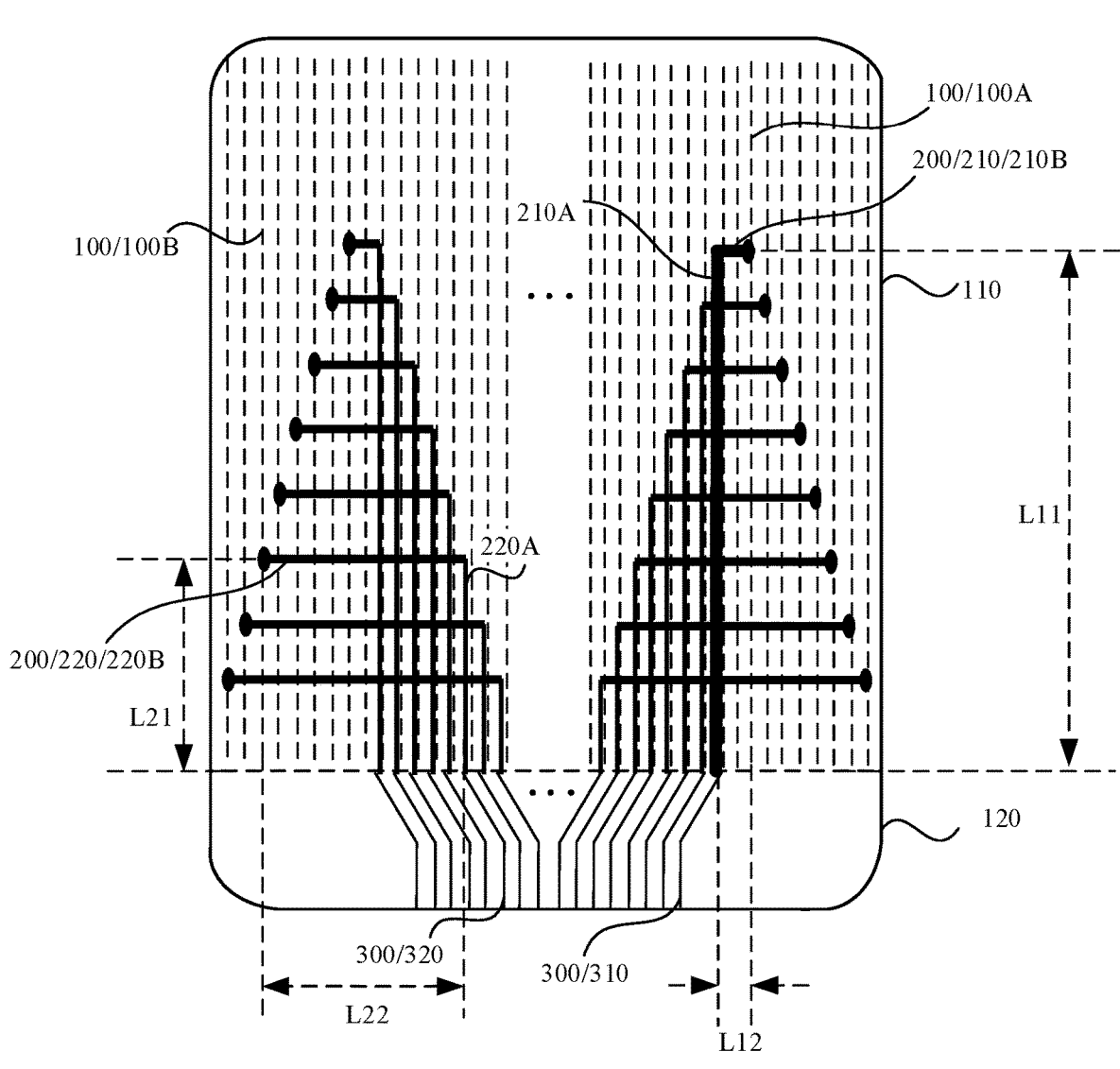
FIG. 15 is a schematic structural view of another display panel provided in an embodiment of the present disclosure.

FIG. 15 is a schematic structural view of another display panel provided in an embodiment of the present disclosure, and referring to FIG. 15, a line width of the first connection wire is D1, and a line width of the second connection wire is D2, and (L11+L12)> (L21+L22), D1>D2.

The first connection wire 210 includes a first sub-subsection 210A and a first sub-wire 210B connected to each other, and a length of the first sub-subsection 210A is L11, and a length of the first sub-wire 210B is L12. The second connection line 220 includes a second sub-subsection 220A and a second sub-wire 220B connected to each other, and a length of the second sub-subsection 220A is L21 and a length of the second sub-wire 220B is L22. Referring to FIG. 15, when the length of the first connection wire 210 is larger than the length of the second connection wire 220, that is, (L11+L12)>(L21+L22), in order to balance the resistance in the connection wire 200, the line width D1 of the first connection wire 210 is larger than the line width D2 of the second connection wire 220. In other words, the adjustment of the resistance of different connection wires 200 is achieved by adjusting the line widths of connection wires with different lengths, that is, the resistance of the connection wires 200 is equalized, the loss of the data signal on the different connection wires 200 is further equalized, and the display effect of the display panel is improved.

Figure 16:
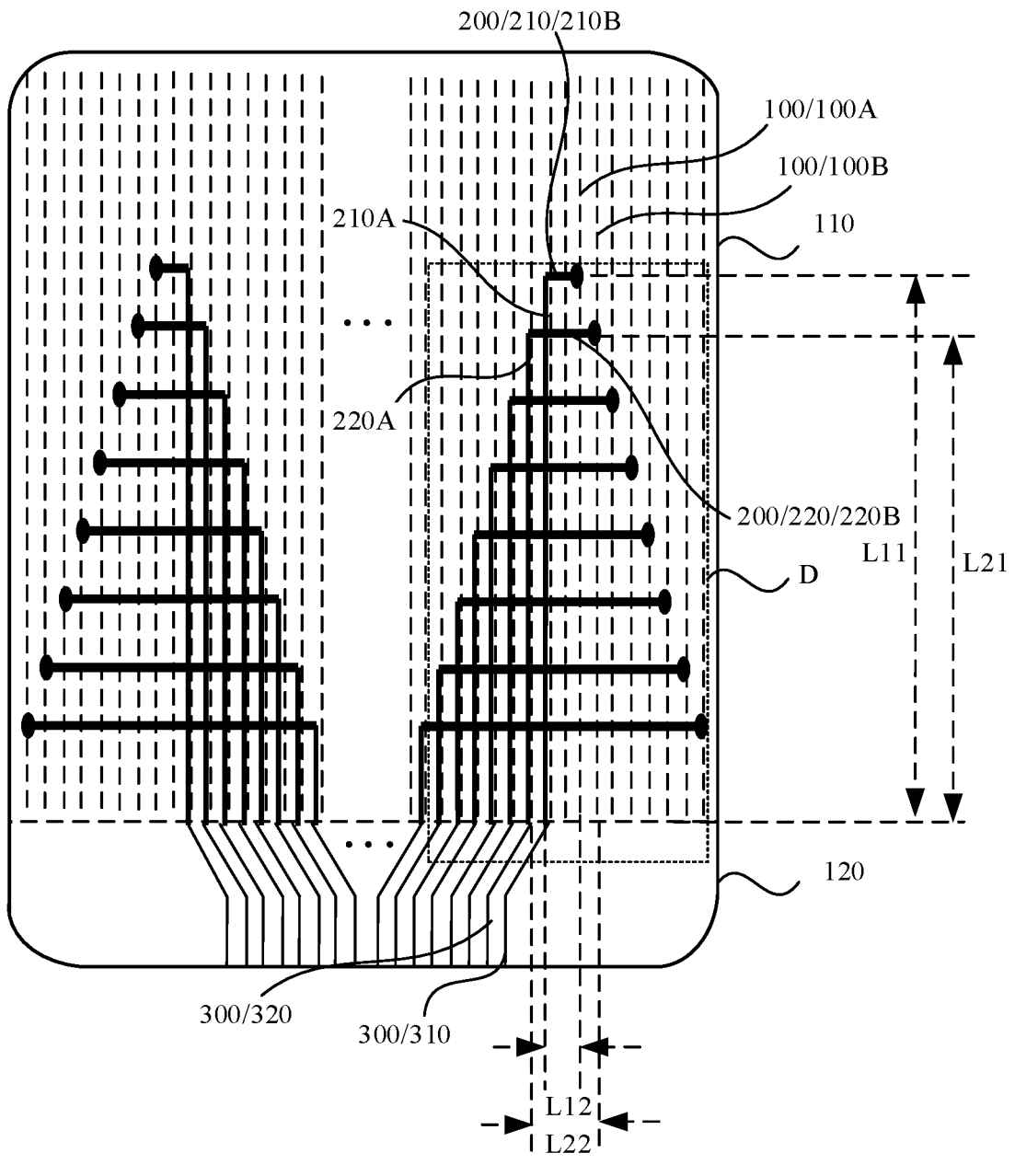
FIG. 16 is a schematic structural view of another display panel provided in an embodiment of the present disclosure.
Figure 17:
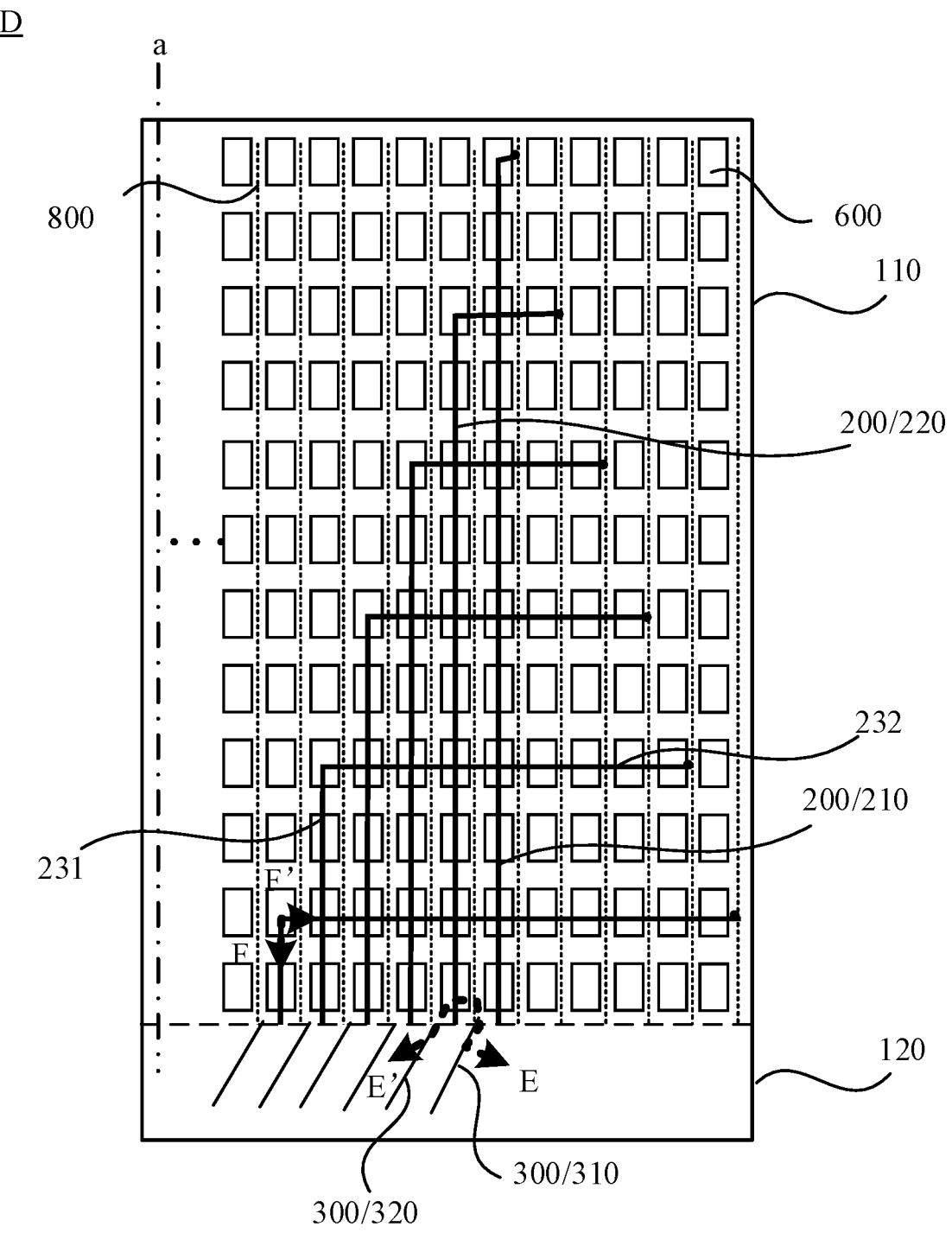
FIG. 17 is an enlarged schematic view of a D region in FIG. 16.
Figure 18:
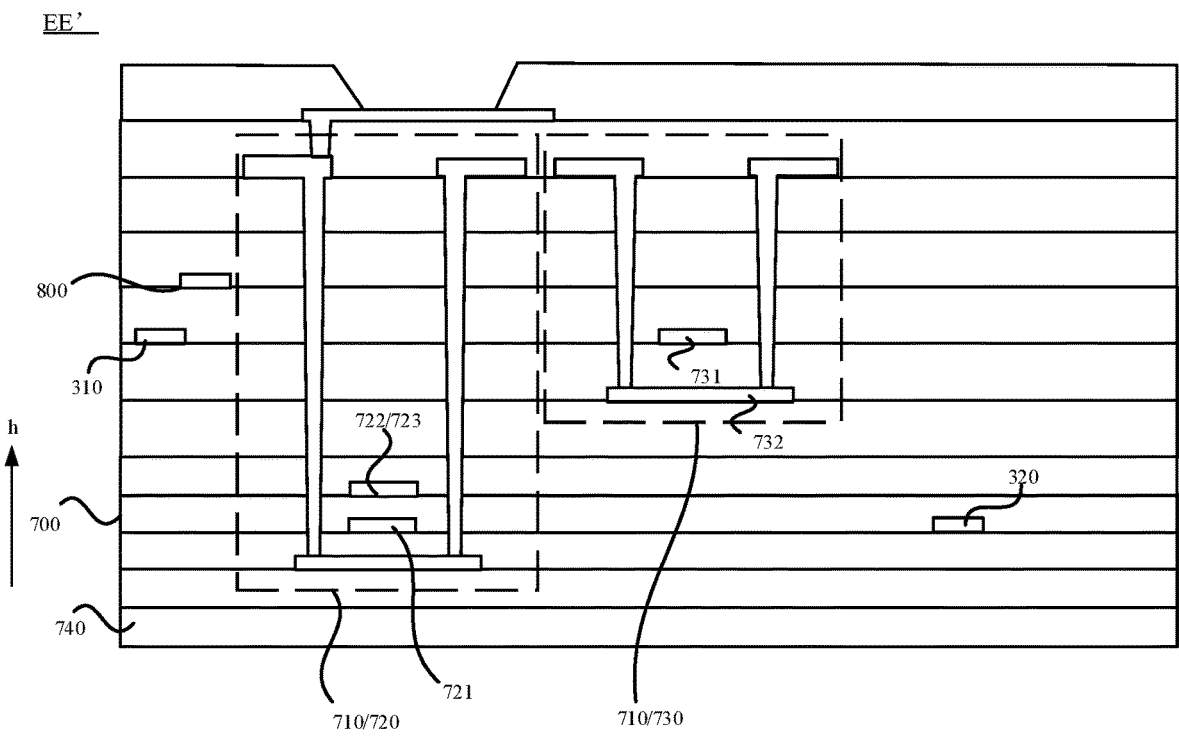
FIG. 18 is a schematic view of a cross-sectional structure along an E-E' direction in FIG. 17.
Figure 19:
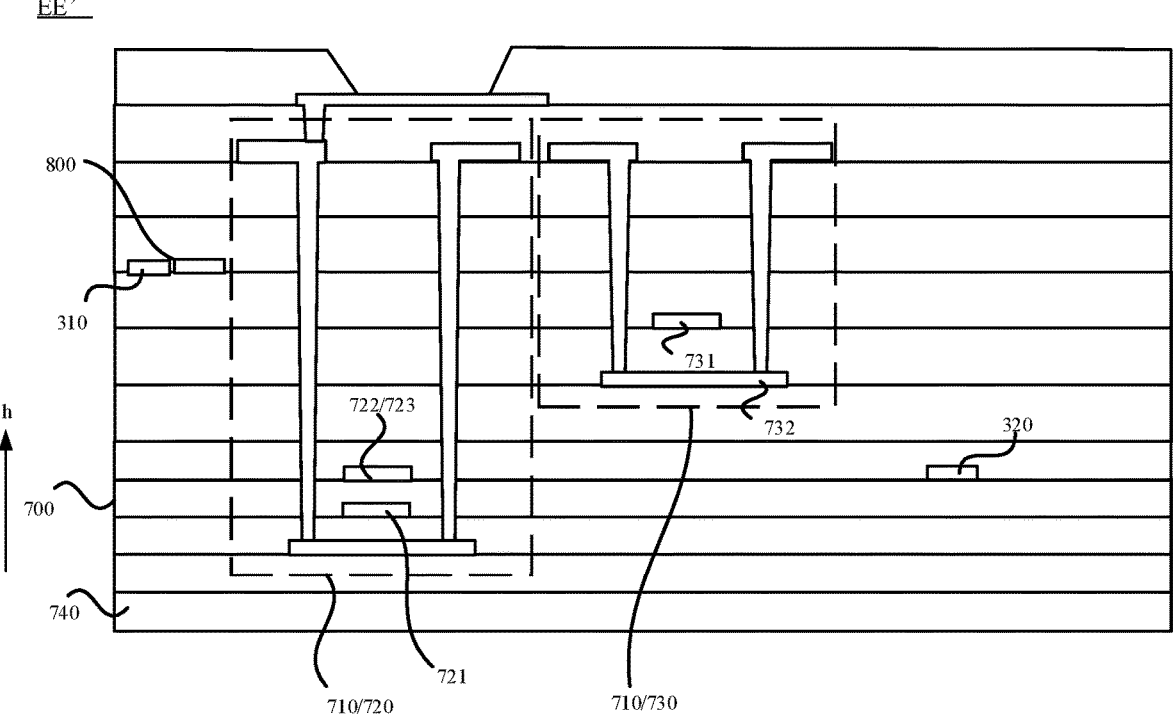
FIG. 19 is a schematic view of another cross-sectional structure along an E-E' direction in FIG. 17.

FIG. 16 is a schematic structural view of another display panel provided in an embodiment of the present disclosure, FIG. 17 is an enlarged schematic view of a D region in FIG. 16, FIG. 18 is a schematic view of a cross-sectional structure along an E-E' direction in FIG. 17, and FIG. 19 is a schematic view of another cross-sectional structure along an E-E' direction in FIG. 17. Referring to FIGS. 16 to 19, the signal wirings 300 includes a first signal wiring 310 and a second signal wiring 320 which are disposed on different layers, and a square resistance of a film layer where the first signal wiring 310 is located is less than a square resistance of a film layer where the second signal wiring 320 is located; (L11+L12)> (L21+L22), the first connection wire 210 is electrically connected to the first signal wiring 310, and the second connection wire 220 is electrically connected to the second signal wiring 320.

In the display panel 10, different film layers have different square resistances, and the multiple signal wirings 300 may be disposed on different film layers, i.e., have different square resistances. Referring to FIGS. 15 to 18, two signal wirings 300, i.e., a first signal wiring 310 and a second signal wiring 320, are exemplified as an example. When the square resistance of the first signal wiring 310 is less than the square resistance of the second signal wiring 320, the data signal transmitted through the second signal wiring 320 may have a larger loss. In other words, the signal wirings 300 of different film layers are connected to the connection wires 200 with different lengths, so that the loss in the data signal transmission process is balanced. The signal wiring 300 with the larger square resistance is connected to the connection wire 200 with a shorter length, and the signal wiring 300 with a smaller square resistance is connected to the connection wire 200 with a longer length, so that the signal loss difference at different positions in the display panel 10 is smaller, and further the display effect of the display panel 10 is improved.

Exemplarily, referring to FIGS. 15 to 18, when (L11+L12)> (L21+L22), the first signal wiring 310 is provided with a small square resistance, that is, when a total length of the first connection wire 210 is large, the first signal wiring 310 is electrically connected to the first connection wire 210, and similarly, the second signal wiring 320 is electrically connected to the second connection wire 220, so as to balance the signal loss in signal transmission at different positions and ensure the display effect of the display panel.

Figure 20:
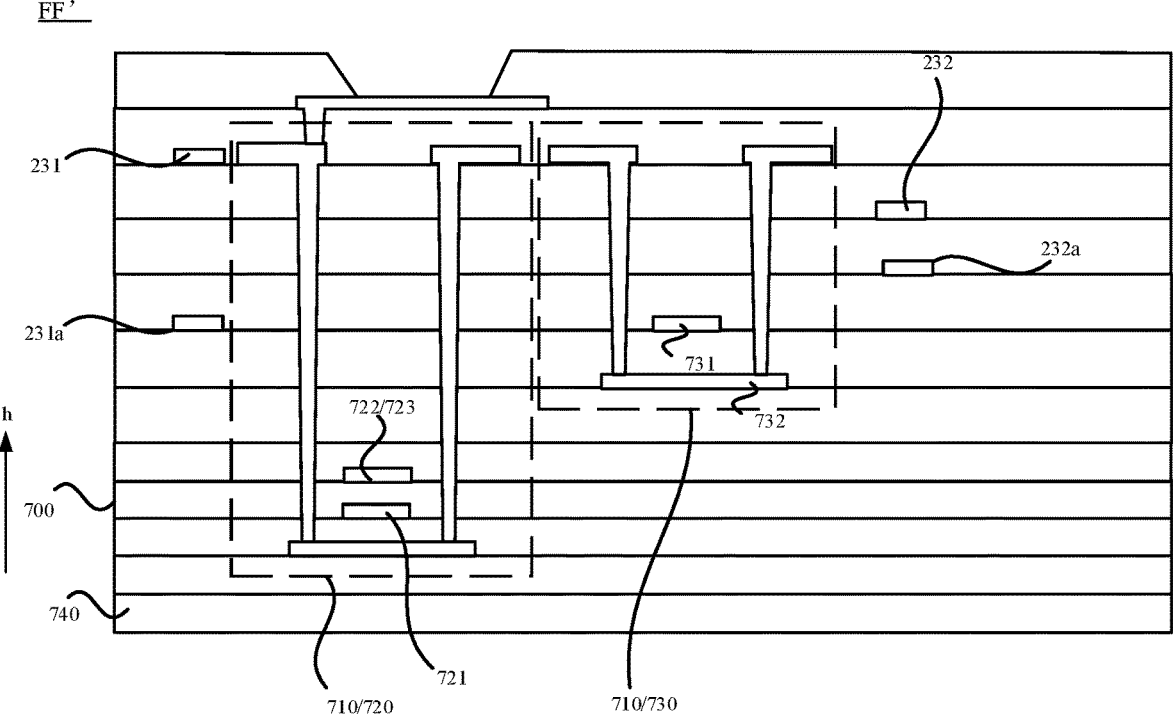
FIG. 20 is a schematic view of another cross-sectional structure along an F-F' direction in FIG. 17.

FIG. 20 is a schematic view of another cross-sectional structure along an F-F' direction in FIG. 17, and with continued reference to FIGS. 16 to 20, the display panel 10 further includes an array substrate 700, the array substrate 700 includes a pixel circuit 710, the pixel circuit 710 includes a polysilicon transistor 720, a semiconductor oxide transistor 730, and a power supply signal wire 800; the polysilicon transistor 720 includes a first gate 721 and a storage capacitor 722, the storage capacitor 722 includes a first capacitor plate 723, and the first capacitor plate 723 is located on a side of the first gate 721 facing away from the substrate 740; the semiconductor oxide transistor 730 includes a second gate 731; and the first signal wiring 310 and the second gate 731 and/or the power supply signal wire 800 are disposed on a same layer, and the second signal wiring 320 and the first gate 721 and/or the first capacitor plate 723 are disposed on a same layer.

The display panel 10 further includes an array substrate 700, the array substrate 700 includes a pixel circuit 710, and the sub-pixels are driven by the pixel circuit 710 to display and emit light. In an embodiment, the pixel circuit 710 includes a polysilicon transistor 720, a semiconductor oxide transistor 730, and a power supply signal wire 800. The polysilicon transistor 720 has the advantages of high switching speed, high carrier mobility and low power consumption, and the semiconductor oxide transistor 730 has the advantages of simple preparation process and low leakage current. The pixel circuit 710 provided in the embodiments of the present disclosure includes the polysilicon transistor 720 and the semiconductor oxide transistor 730 at the same time, so that the advantages of different transistors are brought into full play, and the pixel circuit 710 is ensured to be excellent in performance and high in driving efficiency.

Further, the pixel circuit 710 further includes an active layer, a source and drain electrode, an interlayer insulating layer, an insulating layer and the like which are laminated on the substrate 740, and the film layer may be adaptively adjusted by those skilled in the art according to actual requirements.

In an embodiment, the signal wiring 300 and a metal film layer on the substrate 740 may be disposed on a same layer, whereby the wiring space of the display panel 10 is reduced. Exemplarily, referring to FIG. 17, the first signal wiring 310 and a second gate 731 wire are disposed on a same layer, and the second gate 731 is located on a side of the active layer 732 facing away from the substrate 740 in the semiconductor oxide transistor 730. Referring to FIG. 18, the first signal wiring 310 and the power supply signal wire 800 may also disposed on a same layer, and on this basis, referring to FIG. 17, the second signal wiring 320 and the first gate 721 are disposed on a same layer, and referring to FIG. 18, the second signal wiring 320 and the first capacitor plate 723 may also be disposed on a same layer. The specific arrangement position of the signal wiring 300 is not specifically limited in the embodiments of the present disclosure.

In an embodiment, referring to FIG. 20, the sub-subsection 231 and the sub-wire 232 are located on different film layers, a parallel sub-subsection 231a connected in parallel with the sub-subsection 231 and disposed on different layers may be disposed on a same layer as the second gate 731 wire, and similarly, a parallel sub-wire 232a connected in parallel with the sub-wire 232 may be disposed between a film layer where the sub-wire 232 is located and a film layer where the second gate 731 is located. Further, the parallel sub-subsection 231a and the parallel sub-wire 232a may also be disposed on other film layers, which is not specifically limited in the embodiments of the present disclosure.

With continued reference to FIG. 1, the multiple connection wires 200 includes a third connection wire group 270 and a fourth connection wire group 280, the third connection wire group 270 includes multiple connection wires 200, and the fourth connection wire group 280 includes multiple connection wires 200; the third connection wire group 270 and the fourth connection wire group 280 are respectively located at two sides of the first center axis a of the display panel 10, and an extension direction of the first center axis a is parallel to an extension direction of the data lines 100; the third connection wire group 270 and the fourth connection wire group 280 are symmetrically disposed.

In an embodiment, as shown in FIG. 1, the display panel 10 includes a third connection wire group 270 and a fourth connection wire group 280, and the third connection wire group 270 and the fourth connection wire group 280 both include multiple connection wires, and a number of the connection wires is not specifically limited in the embodiments of the present disclosure.

Further, the third connection wire group 270 and the fourth connection wire group 280 are respectively located at two sides of the first center axis a of the display panel 10, so as to implement the normal transmission of data signals on two sides of the display region 110 of the display panel 10, and ensure the normal display of the display panel 10. Further, the third connection wire group 270 and the fourth connection wire group 280 are symmetrically disposed about the first center axis a, that is, the signal transmission loss on both sides of the first center axis a is further balanced, so as to ensure the display effect of the display panel 10, and the symmetric disposition manner may also effectively simplify the manufacturing process of the display panel 10.

Figure 21:
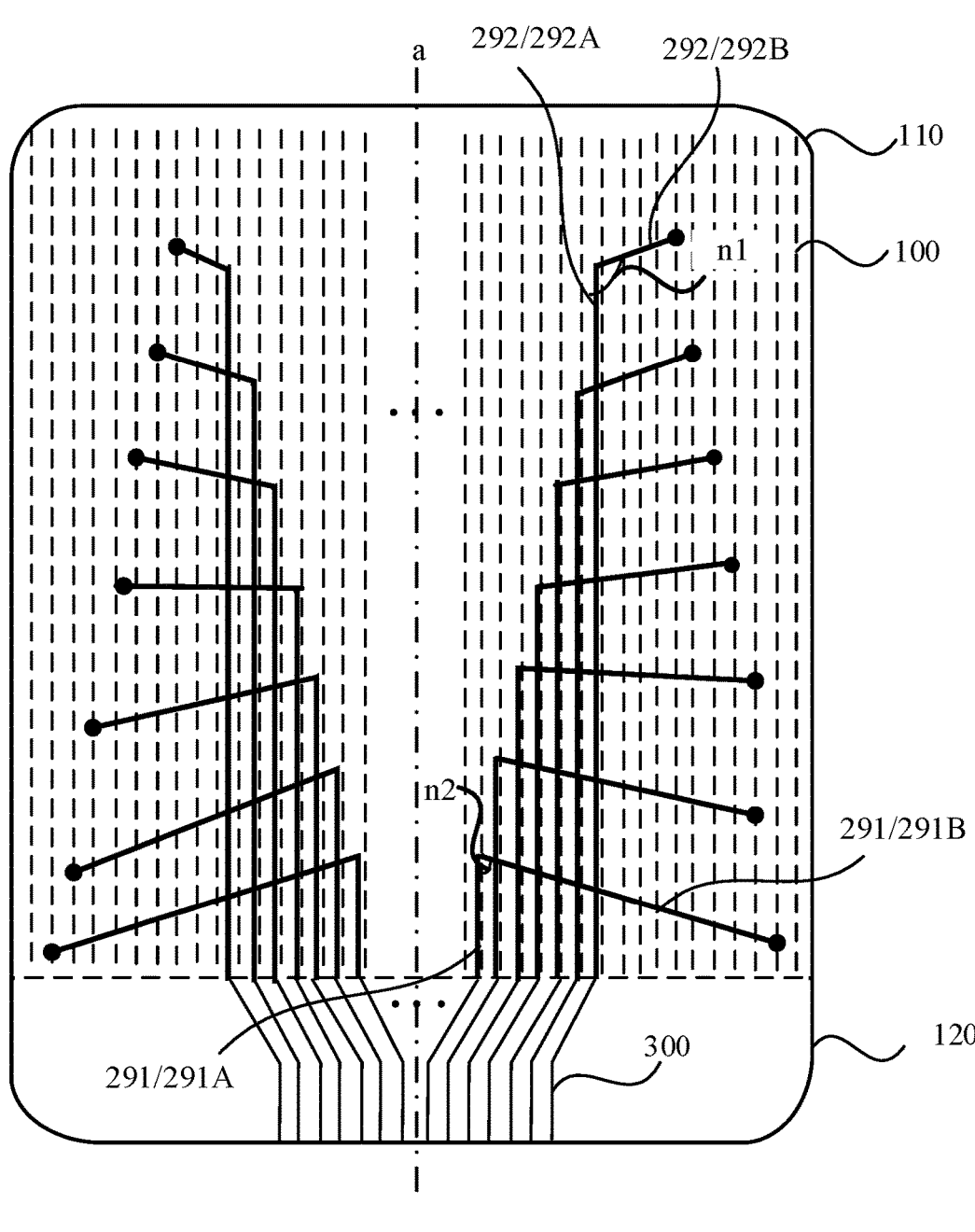
FIG. 21 is a schematic structural view of another display panel provided in an embodiment of the present disclosure.

FIG. 21 is a schematic structural view of another display panel provided in an embodiment of the present disclosure, as shown in FIG. 21, the connection wire 200 further includes a fifth connection wire 291 and a sixth connection wire 292, the fifth connection wire 291 includes a fifth sub-subsection 291A and a fifth sub-wire 291B which are connected to each other, an extension direction of the fifth sub-subsection 291A intersects an extension direction of the fifth sub-wire 291B, the sixth connection line 292 includes a sixth sub-subsection part 292A and a sixth sub-wire 292B which are connected to each other, and an extension direction of the sixth sub-subsection 292A intersects an extension direction of the sixth sub-wire 292B; and an included angle between the fifth sub-subsection 291A and the fifth sub-wire 291B is a first included angle n1, and an included angle between the sixth sub-subsection 292A and the sixth sub-wire 292B is a second included angle n2; where the first included angle n1 is less than the second included angle n2.

The connection wire 200 further includes a fifth connection wire 291 and a sixth connection wire 292, in the fifth connection wire 291, an included angle between the fifth sub-subsection 291A and the fifth sub-wire 291B is a first included angle n1, and in the sixth connection wire 292, an included angle between the sixth sub-subsection 292A and the sixth sub-wire 292B is a second included angle n2. Exemplarily, referring to FIG. 21, the first included angle n1 is less than the second included angle n2, i.e., the adjustment of the included angle between the sub-subsection and the sub-wire of the connection wire 200, whereby different arrangement forms of the connection wire 200 are achieved, and the length of the connection wire 200 is adaptively adjusted based on the change of the included angle, signal losses generated by the connection wires 200 at different positions of the display panel 10 are similar, and further the display effect of the display panel 10 is ensured.

With continued reference to FIG. 21, the fifth sub-subsection 291A is located on a side of the sixth sub-subsection 292A facing the first center axis a of the display panel 10, and the fifth sub-wire 291B is located on a side of the sixth sub-wire 292B facing to the non-display region 120; and an extension direction of the first center axis a is parallel to an extension direction of the data line 100.

Exemplarily, referring to FIG. 21, the fifth sub-subsection 291A is closer to the side of the first center axis a of the display panel 10 than the sixth sub-subsection 292A, and meanwhile the fifth sub-wire 291B is closer to a side of the non-display region 120 than the sixth sub-wire 292B. As a whole, an included angle between the sub-subsection and the sub-wire of the connection wire 200 is a gradual change included angle, that is, an included angle of the connection wire facing the first center axis a and the non-display region 120 at the same time is larger, and an included angle of the connection wire facing away from the first center axis a and the non-display region 120 at the same time is smaller. Through the design of the included angle of the sub-subsection and the sub-wire of the connection wire 200, the stability of the signal transmission of the display panel 10 is ensured, and the design mode of the connection wire is enriched.

Figure 22:
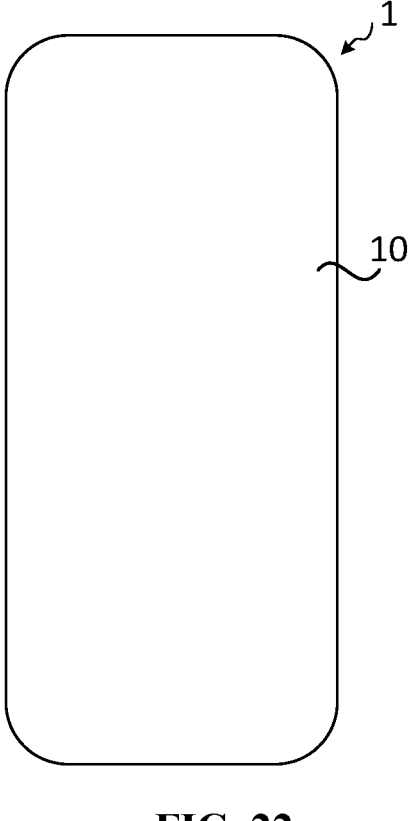
FIG. 22 is a schematic structural view of a display device provided in an embodiment of the present disclosure.

Based on the same inventive concept, an embodiment of the present disclosure further provides a display device, FIG. 22 is a schematic structural view of a display device provided in an embodiment of the present disclosure, as shown in FIG. 22, the display device 1 includes the display panel 10 of any one of the above embodiments. The display device 1 provided in the embodiment of the present disclosure has the corresponding beneficial effects in the above embodiments, which are not repeated here again. Exemplarily, the display apparatus 1 may be an electronic device such as a mobile phone, a computer, a smart wearable device (such as, a smart watch), and a vehicle-mounted display device, which is not limited in the embodiments of the present disclosure.

It should be noted that the above are merely preferred embodiments of the present disclosure and the technical principles applied herein. It should be understood by those skilled in the art that the present disclosure is not limited to the particular embodiments described herein. For those skilled in the art, various apparent variations, rearrangements and substitutions may be made without departing from the protection scope of the present disclosure. Therefore, although the present disclosure has been described in detail through the above embodiments, the present disclosure is not limited to the above embodiments and may include more other equivalent embodiments without departing from the concept of the present disclosure. The scope of the present disclosure is determined by the scope of the appended claims.

What is claimed is:

1. A display panel, comprising a display region and a non-display region at least located on one side of the display region:

wherein the display panel further comprises:

a plurality of data lines, wherein the plurality of data lines are located in the display region, and the plurality of data lines comprises first data lines and second data lines;

a plurality of signal wirings, wherein one of the plurality of signal wirings is connected to a respective one of the plurality of data lines, and the plurality of signal wirings comprises first signal wirings and second signal wirings; and connection wires, wherein the connection wires are located in the display region, the connection wires comprise first connection wires and second connection wires, wherein a first connection wire of the first connection wires is connected to a respective one of the first data lines and a respective one of the first signal wirings, and a second connection wire of the second connection wires is connected to a respective one of the second data lines and a respective one of the second signal wirings;

the first connection wire comprises a first sub-subsection and a first sub-wire which are connected to each other, an extension direction of the first sub-subsection intersects an extension direction of the first sub-wire, the second connection wire comprises a second sub-subsection and a second sub-wire which are connected to each other, and an extension direction of the second sub-subsection intersects an extension direction of the second sub-wire; and a length of the first sub-subsection, a length of the first sub-wire, a length of the second sub-subsection and a length of the second sub-wire are respectively L11, L12, L21 and L22; wherein $(L11-L21) \times (L12-L22) \leq 0$, wherein the display panel further comprises a first center axis, an extension direction of the first center axis is parallel to an extension direction of the plurality of data lines; and the display panel further comprises virtual wires, and the virtual wires comprises at least one of:

the virtual wires are disposed on a side of the first sub-subsection facing away from the non-display region; or the virtual wires are disposed on a side of the first sub wire facing the first center axis, wherein the virtual wires and the connection wires are located on a same layer and each of the virtual wires is connected to a respective one of the connection wires, wherein the display panel further comprises a plurality of sub-pixels located in the display region, wherein the plurality of sub-pixels are arranged in an array;

the connection wires comprise an i-th connection wire and a j-th connection wire, the i-th connection wire comprises an i-th sub-subsection and an i-th sub-wire, and the j-th connection wire comprises a j-th sub-subsection and a j-th sub-wire; the i-th sub-subsection is located on a side of the j-th sub-subsection facing away from the first center axis, and the i-th sub-wire is located on a side of the j-th sub-wire facing away from the non-display region;

n columns of the plurality of sub-pixels are disposed between the i-th sub-subsection and the j-th sub-subsection, and n rows of the plurality of sub-pixels are disposed between the i-th sub-wire and the j-th sub-wire;

a size of each of the plurality of sub-pixels in a first direction is a first size, a size of each of the plurality of sub-pixels in a second direction is a second size, the first direction is parallel to the extension direction of the plurality of data lines, and the second direction is perpendicular to the extension direction of the plurality of data lines;

in a case where the first size is larger than the second size, an extension length of the virtual wire connected to the i-th sub-wire is less than an extension length of the virtual wire connected to the j-th sub-wire; and in a case where the first size is less than the second size, an extension length of the virtual wire connected to the i-th sub-subsection is greater than an extension length of the virtual wire connected to the j-th sub-subsection.

2. The display panel of claim 1, wherein a resistance of the first connection wire is R1, a resistance of the second connection wire is R2, wherein $|R2-R1|/R1 \leq 20\%$.

3. The display panel of claim 1, wherein a connection wire of the connection wires comprises a sub-subsection and a sub-wire which are connected to each other, and an extension direction of the sub-subsection intersects an extension direction of the sub-wire:

the display panel further comprises a first center axis, and an extension direction of the first center axis is parallel to an extension direction of the plurality of data lines; and in the connection wires located on a same side of the first center axis, an extension length of the first sub-subsection is gradually increased in a direction from the first center axis to an edge of the display panel, and an extension length of the first sub-wire is gradually increased in a direction from the display region to the non-display region.

4. The display panel of claim 3, wherein the connection wires comprise a p-th connection wire and a q-th connection wire, and the plurality of data lines comprises an m-th data line and an n-th data line, the p-th connection wire, the q-th connection wire, the m-th data line and the n-th data line are located on a same side of the first center axis: wherein p q and both p and q are positive integers, and m..n and both m and n are positive integers:

the p-th connection wire is electrically connected to the m-th data line, and the q-th connection wire is electrically connected to the n-th data line; and a first sub-subsection of the p-th connection wire is located on a side, facing away from the first center axis, of a first sub-subsection of the q-th connection wire; and the m-th data line is located on a side of the n-th data line facing the first center axis.

5. The display panel of claim 1, wherein the first sub-subsection and the first sub-wire are disposed on different layers.

6. The display panel of claim 1, wherein the first sub-subsection and the plurality of data lines are disposed on a same layer, an extension direction of the first sub-subsection is parallel to an extension direction of the plurality of data lines, and an extension direction of the first sub-wire intersects the extension direction of the plurality of data lines; and a line width of the first sub-wire is greater than a line width of the first sub-subsection.

7. The display panel of claim 1, wherein the virtual wires and the connection wires are disposed in an insulated manner, and the virtual wires are electrically connected to a fixed potential signal terminal.

8. The display panel of claim 1, wherein a connection wire of the connection wires comprises a sub-subsection and a sub-wire which are connected to each other, and an extension direction of the sub-subsection intersects an extension direction of the sub-wire:

the display panel further comprises a plurality of sub-pixels arranged in an array; and the plurality of sub-pixels comprises at least one of:

at least one column of sub-pixels are disposed in two adjacent sub-subsections, or at least one row of sub-pixels are disposed in two adjacent sub-wires.

9. The display panel of claim 1, wherein a line width of the first connection wire is D1, and a line width of the second connection wire is D2, and wherein (L11+L12)>(L21+L22), and D1>D2.

10. The display panel of claim 1, wherein, the plurality of signal wirings comprises first signal wirings and second signal wirings which are disposed on different layers, and a square resistance of a film layer where the first signal wirings are located is less than a square resistance of a film layer where the second signal wirings are located;

(L11+L12)>(L21+L22), the first connection wire is electrically connected to the first signal wiring, and the second connection wire is electrically connected to the second signal wiring.

11. A display device, comprising a display panel, wherein the display panel comprises a display region and a non-display region at least located on one side of the display region;

wherein the display panel further comprises:

a plurality of data lines, wherein the plurality of data lines are located in the display region, and the plurality of data lines comprises first data lines and second data lines;

a plurality of signal wirings, wherein each of the plurality of signal wirings is connected to a respective one of the plurality of data lines, and the plurality of signal wirings comprises first signal wirings and second signal wirings; and connection wires, wherein the connection wires are located in the display region, the connection wires comprise first connection wires and second connection wires, wherein a first connection wire of the first connection wires is connected to a respective one of the first data lines and a respective one of the first signal wirings, and a second connection wire of the second connection wires is connected to a respective one of the second data lines and a respective one of the second signal wirings;

the first connection wire comprises a first sub-subsection and a first sub-wire which are connected to each other, an extension direction of the first sub-subsection intersects an extension direction of the first sub-wire, the second connection wire comprises a second sub-subsection and a second sub-wire which are connected to each other, and an extension direction of the second sub-subsection intersects an extension direction of the second sub-wire; and a length of the first sub-subsection, a length of the first sub-wire, a length of the second sub-subsection and a length of the second sub-wire are respectively L11, L12, L21 and L22; wherein (L11−L21)×(L12−L22) ≤0, wherein the display panel further comprises a first center axis, an extension direction of the first center axis is parallel to an extension direction of the plurality of data lines; and the display panel further comprises virtual wires, and the virtual wires comprises at least one of:

the virtual wires are disposed on a side of the first sub-subsection facing away from the non-display region; or the virtual wires are disposed on a side of the first sub wire facing the first center axis, wherein the virtual wires and the connection wires are located on a same layer and each of the virtual wires is connected to a respective one of the connection wires, wherein the display panel further comprises a plurality of sub-pixels located in the display region, wherein the plurality of sub-pixels are arranged in an array;

the connection wires comprise an i-th connection wire and a j-th connection wire, the i-th connection wire comprises an i-th sub-subsection and an i-th sub-wire, and the j-th connection wire comprises a j-th sub-subsection and a j-th sub-wire; the i-th sub-subsection is located on a side of the j-th sub-subsection facing away from the first center axis, and the i-th sub-wire is located on a side of the j-th sub-wire facing away from the non-display region;

n columns of the plurality of sub-pixels are disposed between the i-th sub-subsection and the j-th sub-subsection, and n rows of the plurality of sub-pixels are disposed between the i-th sub-wire and the j-th sub-wire;

a size of each of the plurality of sub-pixels in a first direction is a first size, a size of each of the plurality of sub-pixels in a second direction is a second size, the first direction is parallel to the extension direction of the plurality of data lines, and the second direction is perpendicular to the extension direction of the plurality of data lines;

in a case where the first size is larger than the second size, an extension length of the virtual wire connected to the i-th sub-wire is less than an extension length of the virtual wire connected to the j-th sub-wire; and in a case where the first size is less than the second size, an extension length of the virtual wire connected to the i-th sub-subsection is greater than an extension length of the virtual wire connected to the j-th sub-subsection.

12. The display device of claim 11, wherein a connection wire of the connection wires comprises a sub-subsection and a sub-wire which are connected to each other, and an extension direction of the sub-subsection intersects an extension direction of the sub-wire:

the display panel further comprises a first center axis, and an extension direction of the first center axis is parallel to an extension direction of the plurality of data lines; and in the connection wires located on a same side of the first center axis, an extension length of the first sub-subsection is gradually increased in a direction from the first center axis to an edge of the display panel, and an extension length of the first sub-wire is gradually increased in a direction from the display region to the non-display region.

\* \* \* \* \*